United States Patent [19]

Haraichi et al.

[11] Patent Number: 5,055,696
[45] Date of Patent: Oct. 8, 1991

[54] MULTILAYERED DEVICE MICRO ETCHING METHOD AND SYSTEM

[75] Inventors: Satoshi Haraichi, Yokohama; Fumikazu Itoh, Fujisawa; Akira Shimase, Yokohama; Takahiko Takahashi, Iruma, all of Japan

[73] Assignee: Hitachi, Ltd., Tokyo, Japan

[21] Appl. No.: 391,304

[22] Filed: Aug. 8, 1989

[30] Foreign Application Priority Data

Aug. 29, 1988 [JP] Japan .................................. 63-212453

[51] Int. Cl.$^5$ .......................................... H01J 37/305
[52] U.S. Cl. ............................... 250/492.2; 250/423 R
[58] Field of Search ................... 250/423 R, 425, 309, 250/310, 492.2, 492.21

[56] References Cited

U.S. PATENT DOCUMENTS

| | | | |
|---|---|---|---|
| 3,309,155 | 12/1975 | Kanomata et al. | 250/309 |
| 4,496,843 | 1/1985 | Kirita et al. | 250/425 |
| 4,503,329 | 3/1985 | Yamaguchi et al. | 250/492.21 |
| 4,609,809 | 9/1986 | Yamaguchi et al. | 219/121 EM |
| 4,698,236 | 10/1987 | Kellogg et al. | 427/140 |
| 4,820,898 | 4/1989 | Slingerland | 215/121.12 |
| 4,874,947 | 10/1989 | Ward | 250/309 |
| 4,876,112 | 10/1989 | Kaito et al. | 437/929 |
| 4,925,755 | 5/1990 | Yamaguchi et al. | 250/492.21 |

FOREIGN PATENT DOCUMENTS 57-13176 1/1982 Japan .
57-13177 1/1982 Japan .
61-24553 10/1986 Japan .

Primary Examiner—Bruce C. Anderson
Attorney, Agent, or Firm—Fay, Sharpe, Beall, Fagan, Minnich & McKee

[57] ABSTRACT

In locally reactive etching by irradiating to a multilayered workpiece reactive beam generated by extracting the reactant gas ionized or by irradiating such focussing beam as ion beam, electron beam or laser beam to the multilayered workpiece in an atmosphere of reactant gas; each layer of a multilayered device comprising a plurality of layers formed on a substrate can be accurately and quickly eteched by detecting the change of the material of the layer currently being etched and after detecting the change of material, switching reactant gas to be ionized or atmospheric reactant gas to one complying with the material of the layer currently being etched. This multilayered device micro etching method can be readily put into practice by a multilayered device micro etching system further comprising means for detecting the change of the material of layer to be etched and means for switching and supplying a plurality of reactant gases, in a micro etching appratus for performing locally rective etching.

19 Claims, 30 Drawing Sheets

FIG. 7

| | REACTANT BEAM | SECTION OF ETCHED PORTION |
|---|---|---|
| a | | |
| b | | |
| c | | |
| d | | |

A-A SECTION

B-B SECTION

C-C SECTION

MULTILAYERED DEVICE MICRO ETCHING METHOD AND SYSTEM

BACKGROUND OF THE INVENTION

This invention relates to a micro etching method and a system suited for highly selective etching of each layer of a multilayered LSI using a focused beam.

The sample micro etching method used in conventional focused ion beam working apparatuses such as a photomask repair system or an ion micro analyzer (IMA) is a sputtering etching method to sputter atoms from each sample by ion beam irradiation.

FIG. 2 shows the basic configuration of conventional focused ion beam working apparatuses. Ion beam 2 extracted from ion source 1 is focused by focusing lens 4, and irradiated onto sample 10 for sputtering etching. A chemical vapor deposition (CVD) gas is supplied onto the sample via nozzle 16 simultaneously with ion beam irradiation for local film forming. The ion beam is turned ON or OFF by blanking controller 12 and the ion beam deflection is controlled by deflecting controller 13. Secondary electrons or ions generated from sample 10 by ion beam irradiation are detected by secondary particle detector 9 (for example, a microchannel plate), and a scanning ion microscope (SIM) image is produced. This SIM image can be used for surface observation of the sample. Japanese Patent Laid-Open 245553/1986 is associated with such focused ion beam working apparatuses.

In FIG. 2, reference numeral 3 denotes an extracting electrode, 5 a beam limiting aperture, 6 a blanking electrode, 7 a blanking aperture, 8 a deflecting electrode, 11 a stage, 14 a valve, 15 a CVD gas cylinder, 17 a chamber, and 18 an all system controller.

Japanese Patent Laid-Open 13176/1982 is associated with a sample etching method, different from the simple sputtering etching method, which uses a chemical reaction by a reactive beam consisting of an ionized reactant gas. Japanese Patent Laid-Open 13177/1982 is associated with another etching method, which uses a chemical reaction generated when a focused ion beam is irradiated onto a sample in a reactant gas atmosphere.

U.S. Pat. Nos. 4503329 and 4609809 and U.S. Patent Application Ser. No. 32753 are associated with direct etching by a focused beam but do not contain reactive etching.

At present, semiconductor devices such as LSIs use multilayered conductors or devices to achieve high integration and sophisticated performance. There is an increasing demand that, when etching multilayered LSIs, which are highly dense in the vertical direction and have overlapped uneven layers, the etching can be stopped at a specified layer without causing damage to the lower layers.

There is another increasing demand that, for LSI design debugging and production process error analyses, the circuit repair time can be minimized by directly disconnecting or connecting LSI conductors by local etching. Such circuit repair requires etching at several tens locations of a LSI. Consequently, high speed etching and a high yield of about 100% are required.

Problems on etching of multilayered LSIs, which are imposed on conventional focused ion beam working apparatuses using the simple sputtering etching method, are as follows:

(1) The etching speed is almost proportional to the beam current. To produce a fine beam, however, high speed etching cannot be done because the beam current is restricted.

(2) The etching selectivity for the workpieces material is low, so that it is difficult to stop etching at the specified layer of a multilayered LSI because each layer of the LSI is etched at a uniform speed.

(3) The etching speed on an inclined face is high, so that the etched hole bottom is easily flattened and accurate etching along each uneven layer of a multilayered LSI cannot be done, causing damage partially to the under layer.

Etching by a chemical reaction between reactant gas molecules and a workpiece, such as reactive ion etching (RIE), can provide an extremely high etching speed, which is several tens fold of the sputtering etching speed, by increasing the reaction probability by gas pressure or ion energy. Use of an appropriate reactant gas enhances the etching selectivity of the etched layer to the under layer and provides accurate etching which causes no damage to the uneven under layer.

Japanese Patent Laid-Open 13176/1982 and Japanese Patent Laid-Open 13177/1982 are associated with systems which perform chemically reactive etching locally on a workpiece by using a reactant gas and a focused ion beam. The systems are designed to select a reactant gas according to a combination of the material of a special workpiece and that of its substrate and to etch selectively only one upper layer of the workpiece. On the other hand, the inventors of the present invention consider that, for example, in the case of a workpiece consisting of a laminate of Al conductor layers, $SiO_2$ layers, $Si_3N_4$ layers and the like, the layer to be etched and the under layer change by etching and an optimum reactant gas should be selected and supplied sequentially. For that purpose, changes of each etched layer should be exactly detected and reactant gases should be able to be efficiently selected and supplied in a short time. The systems mentioned above give no consideration to such problems, and accurate etching of multilayered LSIs is impossible.

SUMMARY OF THE INVENTION

The purpose of this invention is to provide a micro etching method and system which permit accurate etching of a multilayered device, consisting of more than one layer on its substrate, along each uneven layer at a high speed.

To accomplish the purpose, when multilayered device is subjected to locally reactive etching using a reactant gas, optimum reactant gases (the etching speed is high and the etching selectivity of the layer to be etched to the under layer is high) are sequentially selected and supplied according to changes of the layer to be etched and the under layer by etching. There are two locally reactive etching methods available, one uses a reactive beam of an ionized reactant gas and the other irradiates a focused energy beam (ion beam, electron beam, or laser beam) onto a workpiece in a reactant gas atmosphere to produce a chemical reaction on the irradiated part.

When a system, which uses a reactive beam of an ionized and extracted reactant gas, is used, cylinders containing different reactant gases should be connected to the ionization chamber of an ion source with valves. By doing this, the reactant gases sequentially supplied into the ionization chamber can be selected according to changes of the layer to be etched and the under layer by etching and an optimum reactive beam can be irradiated onto a workpiece.

When a system, which irradiates a focused energy beam onto a sample in a reactant gas atmosphere to produce a chemical reaction on the irradiated part, is used, reactant gas molecules adsorbed into the sample surface should be replaced in a short time. For that purpose, in the first method, nozzles to be used to spray a gas locally on the sample surface and cylinders containing different reactant gases, connected to the nozzles with valves, should be prepared. And, a temperature control unit to control the sample temperature in a short time should also be installed on the stage. By doing this, the reactant gas to be sprayed on the sample surface can be switched in a short time by changing the valve, and gas adsorption and deadsorption can be controlled by raising or lowering the sample temperature. In the second method, a subchamber with a small volume to contain samples, which the reactant gas cylinders are connected to with valves, should be installed. The subchamber should be provided with an orifice in the top, through which a focused energy beam is irradiated onto a sample. And, a temperature control unit to control the sample temperature in a short time should also be installed on the stage. After the gas is evolved from the subchamber, another reactant gas can be supplied into it in a short time by changing the valve, and gas adsorption and deadsorption can be controlled by raising or lowering the sample temperature. The first or second method allows reactive etching to be locally done by adsorbing optimum reactant gas molecules into the sample surface sequentially according to changes of the layer to be etched and the under layer by etching.

BRIEF DESCRIPTION OF THE DRAWINGS

FIGS. 6 and 7 show the principle schematic diagrams of the multilayered LSI etching method of this invention;

DESCRIPTION OF THE PREFERRED EMBODIMENTS

Embodiments 1 i) Configuration of the micro etching system

Figure 1:
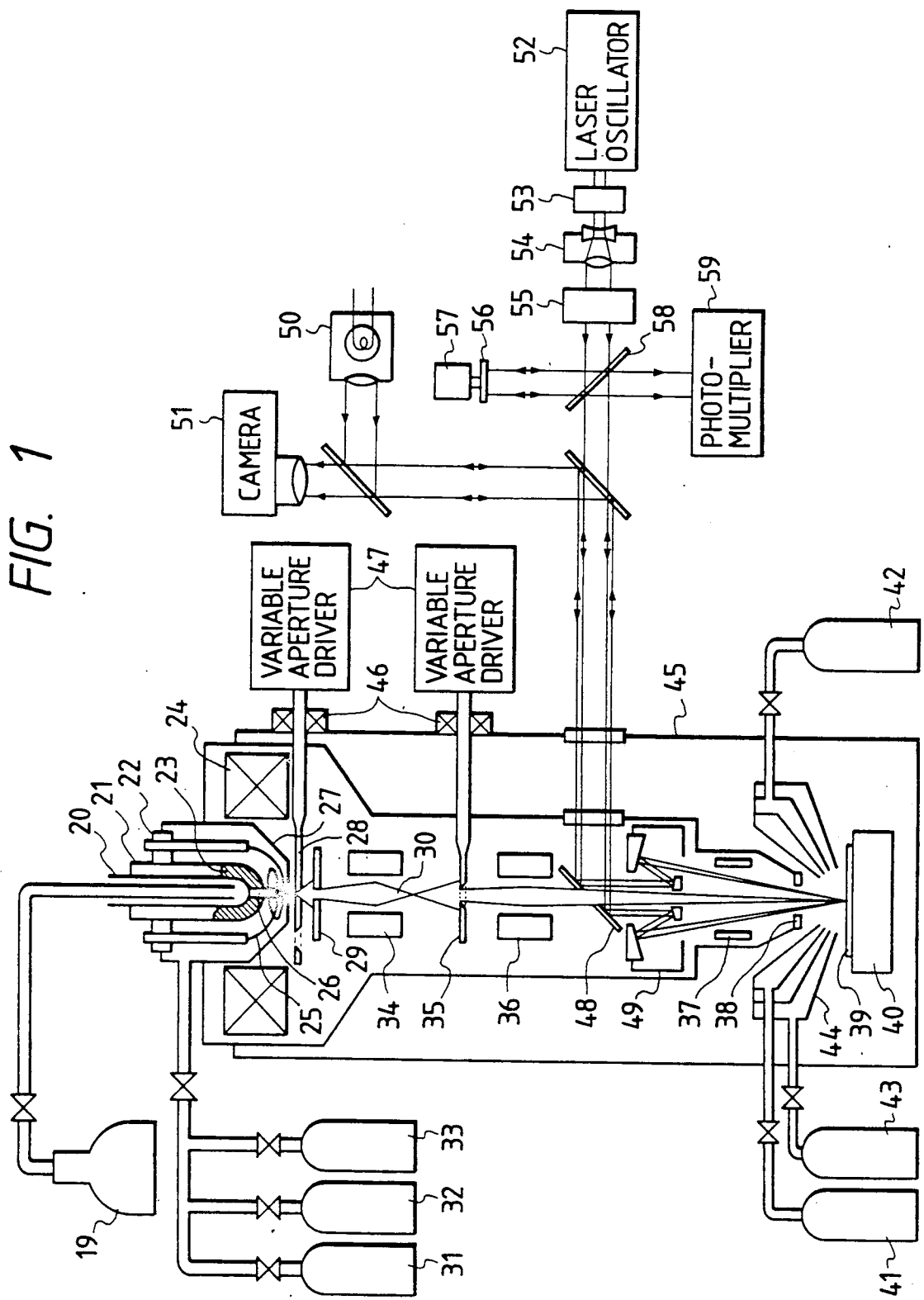
FIG. 1 shows the schematic diagram of a micro etching system of Embodiment 1 of this invention.
Figure 2:
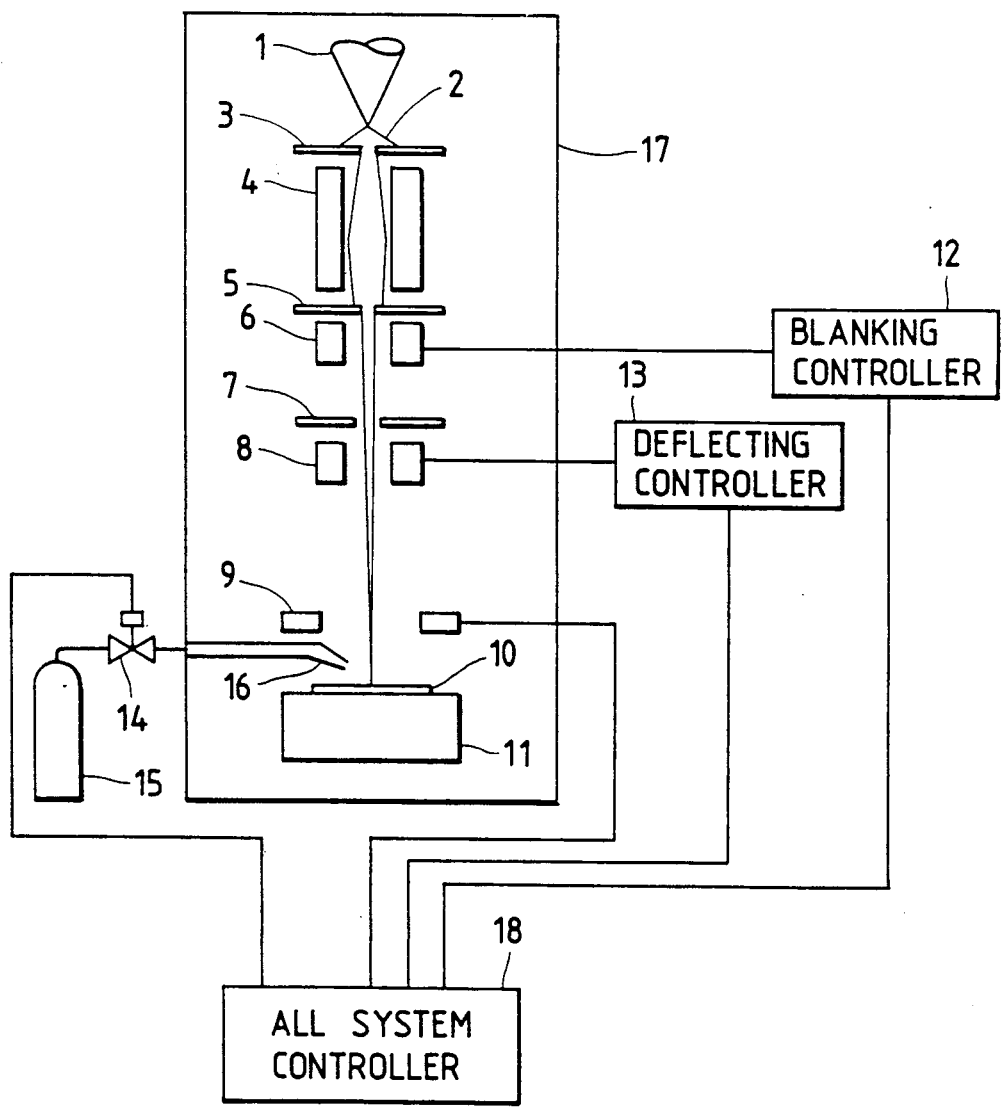
FIG. 2 shows the schematic diagram of a conventional micro etching system.

FIG. 1 shows the configuration of a micro etching system of Embodiment 1 of this invention. The ion source unit at the upper part of the system is designed so that it functions as three ion sources such as a duoplasmatron ion source, a liquid metal ion source, and a field ionization gas ion source. Ion beam 30 extracted from the ion source is focused via preceding focusing lens 34, variable aperture 35, and latter focusing lens 36, and irradiated onto sample 39. Simultaneously, the etching gas is supplied onto the surface of sample 39 from etching gas cylinder 41 or 42 via nozzle 44 to perform reactive etching locally in the ion beam irradiated area. Simultaneously with ion beam irradiation, the CVD gas is also supplied onto the surface of sample 39 from CVD gas cylinder 43 via nozzle 44 to form a local film in the ion beam irradiated area. During this operation, a voltage is applied to the blanking electrode, which is not shown in FIG. 1, to turn the ion beam ON or OFF, and a voltage is applied to deflecting electrode 37 to control the deflection. Secondary particles (secondary electrons, secondary ions, etc.) generated from sample 39 by ion beam irradiation are detected by secondary particle detector 38, and SIM images are produced In this invention, focused light is irradiated onto a multilayered LSI or a workpiece simultaneously with the ion beam to detect changes of the layers by etching, so that reflected light or scattered light is generated. Accordingly, secondary particle detector 38 should not be a detector which uses light for detection (for example, a combination of a scintillator and a photomultiplier) but should be a detector which multiplies secondary particles directly by electrons (a microchannel plate, channeltron, etc.).

Reflecting mirror 48 with a hole at its center is installed on the ion beam axis. The ion beam is irradiated onto sample 39 through this hole. The light from observation lamp 50 enters vacuum chamber 45 via the half mirror and window, is reflected off of reflecting mirror 48, and focused on sample 39 via reflecting objective 49. The reflected light from sample 39 passes the same path reversely and is imaged on camera 51, providing a light microscope image. Concurrent irradiation of the ion beam and the focused light on the sample by overlapping the ion beam etching area with the light focusing area permits etching by monitoring changes of the workpiece status of etching by viewing light microscope images The laser beam for laser oscillator 52 passes shutter 53, is expanded in beam diameter by light path expander 54, and passes variable transmittance filter 55. The laser beam is turned ON or OFF by shutter 53, and the laser beam intensity is adjusted by variable transmittance filter 55. The laser beam is divided into two paths by beam splitter 58, and one of the split beams enters vacuum chamber 45 via the window. The incoming laser beam is reflected off of reflecting mirror 48 and focused on sample 39 by reflecting objective 49. To minimize the loss rate of laser beam intensity by the hole at the center of reflecting mirror 48, the beam diameter is expanded by light path expander 54. The reflected light from sample 39 passes the same path reversely, is bent in path by beam splitter 58, and enters photomultiplier 59. Another laser beam, which is a split beam by beam splitter 58, is reflected off of reflecting mirror 56 and enters photomultiplier 59 via beam splitter 58. The reflected light from sample 39 interferes with the reflected light from reflecting mirror 56, and the interference light intensity is measured by photomultiplier 59. The difference in light path between the two beams can be finely adjusted by slightly moving reflecting mirror 56 using piezoelectric device 57. By using a laser beam interferometer configured as mentioned above, a workpiece can be etched by measuring the relative height of the etching surface or the etched depth. Using the energy from the focused laser beam, the etching gas can be supplied for locally reactive etching or the CVD gas can be supplied for local film forming. The laser beam intensity can be adjusted to an optimum value by variable transmittance filter 55, such as to low power for etched depth measurement or to high power for local etching or local film forming.

In FIG. 1, reference numeral 19 designates a liquid helium cylinder, 20 a cooling chamber, 21 a source material container, 22 a current supply terminal, 23 a source material, 24 an electromagnet, 25 a filament, 26 an emitter, 27 an ionization chamber, 28 a variable aperture, 29 an extracting electrode, 31 to 33 source gas cylinders, 40 a stage (positioned in the X, Y, and Z directions by the drive unit, which is not shown in the figure), 46 a magnetic seal, and 47 the drive unit of the variable aperture.

ii) Ion source unit

Figure 3:
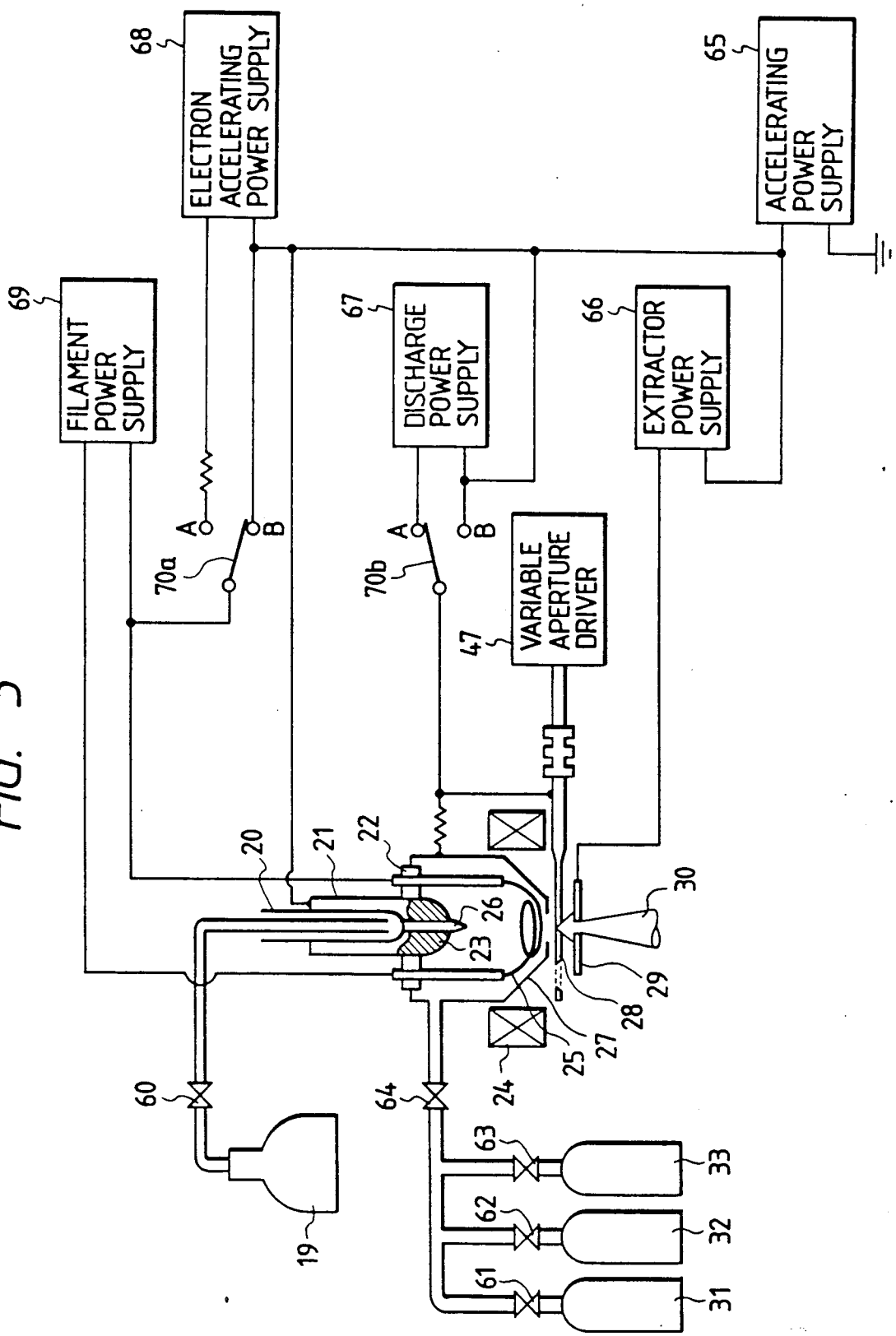
FIG. 3 shows the operation schematic diagram of the ion source of Embodiment 1 as a duoplasmatron ion source.
Figure 4:
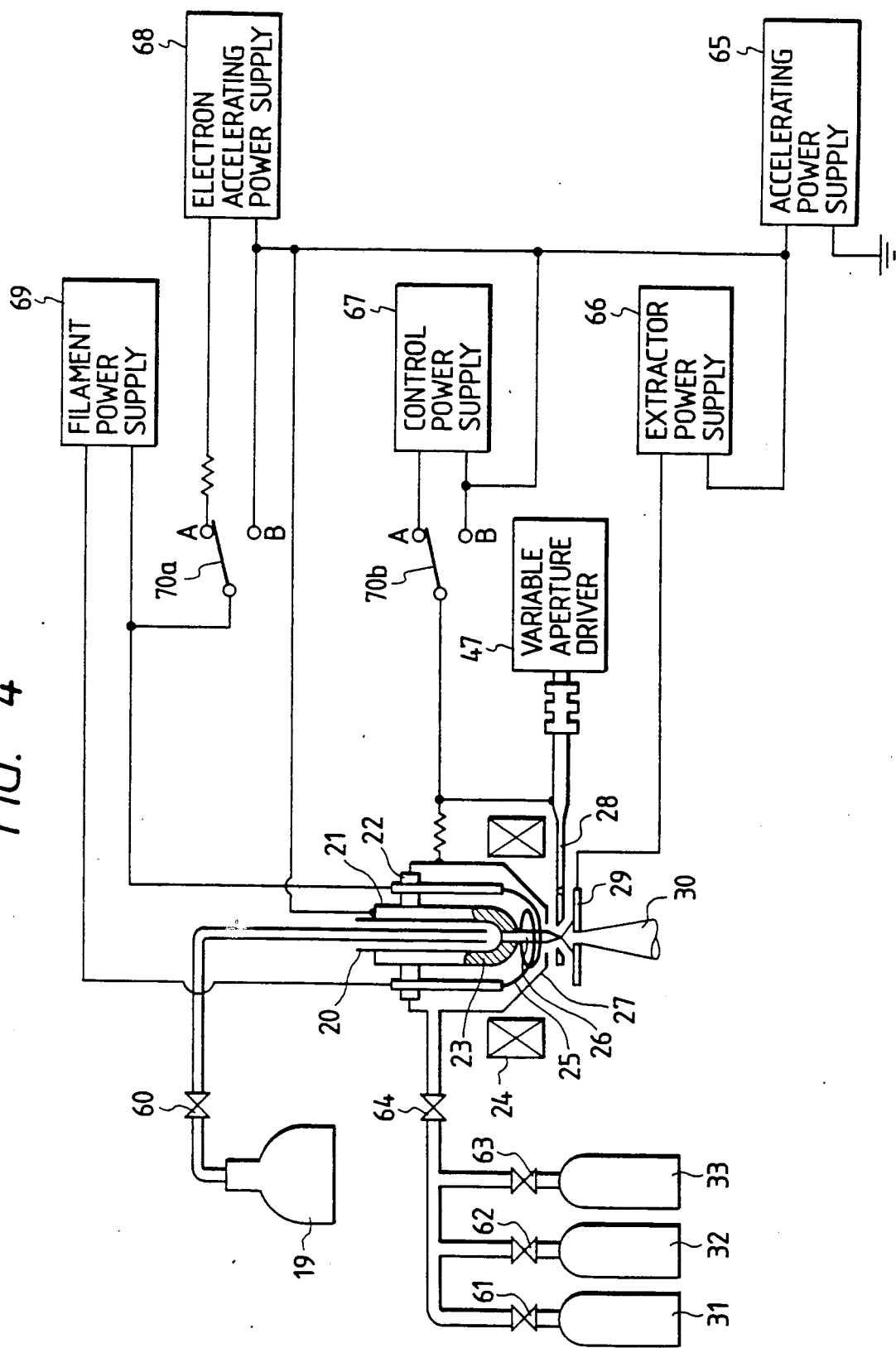
FIG. 4 shows the operation schematic diagram of the ion source of Embodiment 1 as a liquid metal ion source.
Figure 5:
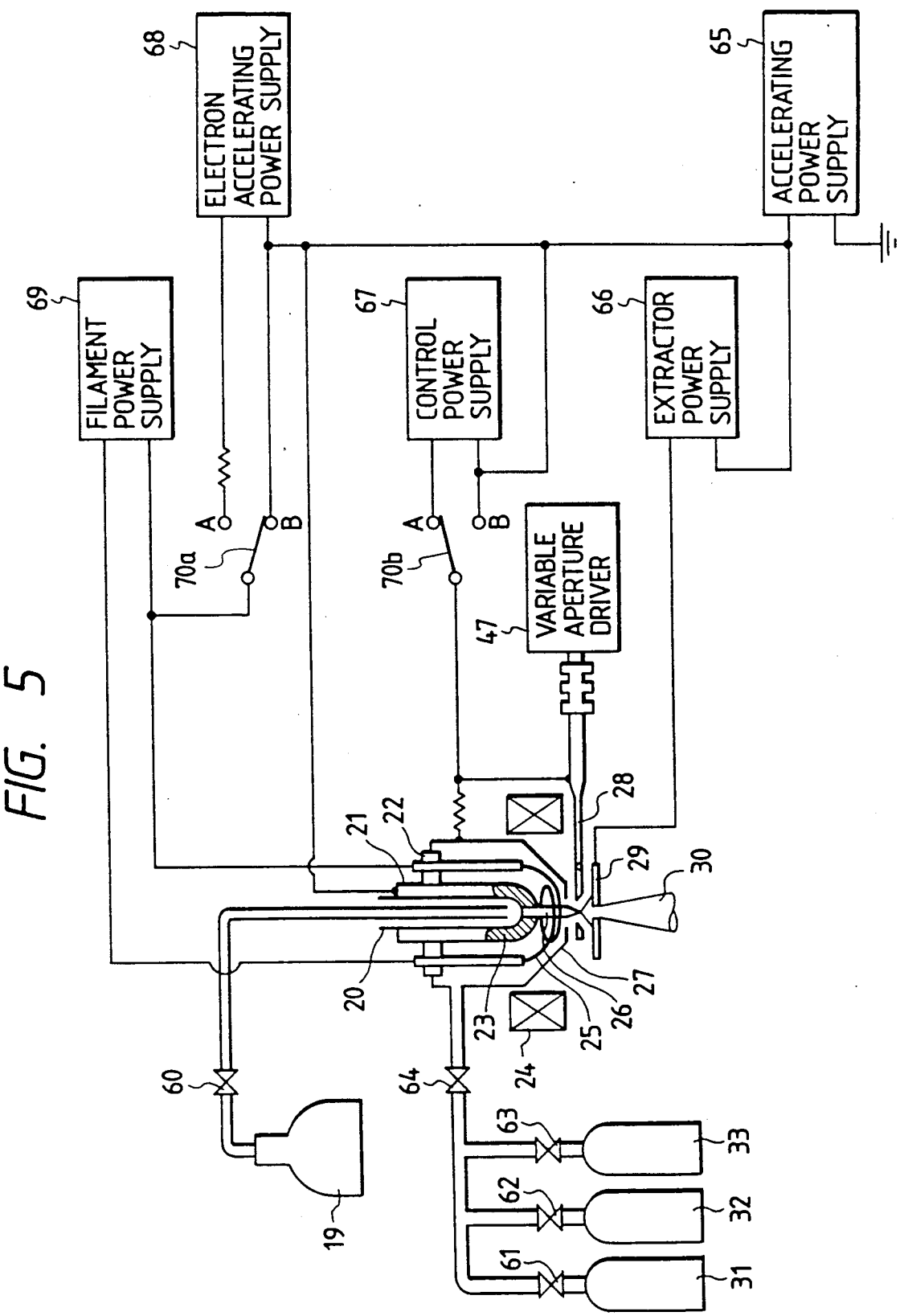
FIG. 5 shows the operation schematic diagram of the ion source of Embodiment 1 as a field ionization ion source.

FIGS. 3 to 5 show the ion source unit of this embodiment. The ion source is designed to function as a duoplasmatron ion source, a liquid metal ion source, or a field ionization gas ion source (three ion sources in total) by switching the machinery, including the ion emitter, and the power unit. Ion emitter 26, which is one of the major units, is connected to chamber 20 and can be moved vertically for position adjustment. Container 21 for source material 23 to be used as a liquid metal ion source is installed near the emitter so that it can be independently moved up and down. These components are installed within ionization chamber 27, to supply a source gas in, together with filament 25. Variable aperture 28 under the bottom of the chamber functions as an ion emission control electrode when the aperture is used as a large aperture or as a duoplasmatron ion emitter when the aperture is switched to a small aperture. Emitter 26 can be cooled to lower than 50 K by supplying liquid helium from liquid helium cylinder 19 into cooling chamber 20 or can be heated to higher than 1000° C. by giving a shock to the emitter with thermoelectrons from filament 25. Source gas cylinders 31 to 33 can be used to select and supply various reactant gases ($CF_4$, $SF_6$, $CCl_4$, $Cl_2$, etc.) or inert gases (Ar, Xe, etc.) into ionization chamber 27 and to extract them as ion beams. The power unit consists of accelerating power supply 65, extractor power supply 66, control power supply (discharge power supply) 67, electron accelerating power supply 68, filament power supply 69, and selector switches 70a and 70b. Accelerating power supply 65 supplies energy to ions, and extractor power supply 66 applies the voltage, necessary to extract an ion beam, to extracting electrode 29. Control power supply (discharge power supply) 67 functions as a discharge power supply to ionize gases when the ion source unit is operated as a duoplasmatron ion source, or as a control power supply to stabilize ion emission when the ion source unit is operated as another ion source.

FIG. 3 shows the operation of the ion source unit of this embodiment, which is used as a duoplasmatron ion source. During this operation, emitter 26 and source material container 21 do not function, so that variable aperture 28, which is set to the highest position, is switched to a small aperture and operated as an ion emitter. Filament 25 is applied with a voltage from filament power supply 69 to function as an electron source to excite emission. Selector switch 70a is connected to contact B and keeps emitter 26 and filament 25 at the same potential to prevent electrons from being extracted from filament 25 to emitter 26. Selector switch 70b is connected to contact A and applies the discharge voltage between filament 25 and variable aperture 28 from discharge power supply 67.

To use the ion source unit as a duoplasmatron ion source, select the target gas from source gas cylinders 31 to 33, and supply an appropriate amount of gas into ionization chamber 27 via flow rate adjusting valve 64. Then, apply the discharge voltage between filament 25 and variable aperture 28. Discharge is excited by electrons from filament 25, and plasma is produced. The plasma is kept within a magnetic field of several hundreds gauss generated by magnet 24 between the bottom of ionization chamber 37 and variable aperture 28, and increased in density. Extracting electrode 29 is applied with a voltage, and ion beam 30 is extracted from variable aperture 28. The diameter of the variable aperture corresponds to the ion emission source diameter. To generate an appropriate beam current, however, the diameter should be set to about 100 μm.

In FIG. 3, reference numeral 22 designates a current supply terminal, 47 the drive unit of the variable aperture, and 60 to 63 valves.

FIG. 4 shows the operation of the ion source unit, which is used as a liquid metal ion source Variable aperture 28 is switched to a large aperture to operate as a control electrode. Emitter 26 is locationed so that it slightly protrudes from variable aperture 28 passing through the center of filament 25. Source material container 21 is locationed so that it can supply an appropriate amount of source material (liquid metal) 23 to the tip of emitter 26. Filament 25 is applied with a voltage from filament power source 69 to be used as an electron source to heat source material 23 and emitter 26. Selector switch 70a is connected to contact A and applies the electron shock voltage between filament 25 and emitter 26 from electron accelerating power supply 68. Selector switch 70b is connected to contact A and applies the control voltage between ionization chamber 27, which operates as a control electrode, and variable aperture 28 to stabilize emission of ion beam 30.

To use the ion source unit as a liquid metal ion source, generate thermoelectrons from filament 25 and accelerate them with a voltage from electron accelerating power supply 68. Source material container 21 and emitter 26 are heated by a shock by the accelerated electrons, and source material 23 is melted and coated on the surface of emitter 26 up to its tip. A voltage is applied between emitter 26 and extracting electrode 29 from extractor power supply 66 to extract ion beam 30 from the tip of emitter 26.

In FIG. 4, reference numeral 19 designates a liquid helium cylinder, 20 a cooling chamber, 22 a current supply terminal, 24 an electromagnet, 31 to 33 source material cylinders, 60 to 64 valves, 68 an accelerating power supply, and 67 a control power supply.

FIG. 5 shows the operation of the ion source unit, which is used as a field ionization gas ion source. Variable aperture 28 is switched to a large aperture to operate as a control electrode. Emitter 26 is locationed so that it slightly protrudes from variable aperture 28. Source material container 21 is locationed upward so that it does not disturb the electric field near the tip of emitter 26. Selector switch 70a is connected to contact B and keeps filament 25 and emitter 26 at the same potential to prevent disturbance of the electric field near the tip of emitter 26. Selector switch 70b is connected to contact A and applies the control voltage to ionization chamber 27 and variable aperture 28 to stabilize emission of ion beam 30. When the system enters the stationary operation state in which ions are stably emitted without the control voltage being applied, selector switch 70b is connected to contact B and keeps emitter 26 and variable aperture 28 at the same potential to allow the electric field to be concentrated near the tip of emitter 26 and to keep the parallel electric field between variable aperture 28 and extracting electrode 29 stable. The same may be said for with the operation as a liquid metal ion source.

To use the ion source unit as a field ionization gas ion source, the surface of emitter 26 should be cleaned so that gas molecules can be easily adsorbed in. In FIG. 5, connect selector switch 70a to contact A, accelerate thermoelectrons generated from filament 25, and heat emitter 26 by a shock of the accelerated thermoelectrons to clean the surface. Or, operate this ion source as a liquid metal ion source, form a cone of liquid metal at the tip of emitter 26, and cool it as it is. The solidified liquid metal has an effect the same as the cleaned surface, and a cone with a sharp tip allows the electric field to concentrate near the tip and increases the ionization efficiency. After the surface of emitter 26 is cleaned, liquid helium is supplied into cooling chamber 20 to cool emitter 26. The target gas can be selected from source gas cylinders 31 to 33, and an appropriate amount of gas is supplied into ionization chamber 27 via flow rate adjusting valve 64. A voltage is applied between emitter 26 and extracting electrode 29 from extractor power supply 66, gas molecules adsorbed in the surface of cooled emitter 26 are ionized at the tip of emitter 26, and ion beam 30 is extracted.

Reference numerals 19, 20, 22, 23, 24, 60, 61, 62, 63, 65, 67, 68, and 69 in FIG. 5 designate the same as those in FIG. 3.

The table below gives the operation characteristics of the three ion sources of this embodiment.

|  | Brightness (A/Sr. cm$^2$) | Current density per unit radiation angle (A/Sr) | Source diameter | Energy Spread (eV) |
| --- | --- | --- | --- | --- |
| Duoplasmatron ion source | $10^2$ | $10^{-2}$ | 100 μm | 10~50 |
| Liquid metal ion source | $10^6$ | $10^{-5} \sim 5 \times 10^{-5}$ | 100~500Å | 5~20 |
| Field ionization gas ion source | $10^7$ | $10^{-5} \sim 5 \times 10^{-5}$ | 10Å | 1 |

The current and diameter of the focused ion beam, which is an etching probe, are greatly affected by the ion source characteristics mentioned above when the performance of the focusing optical system is shared. As the brightness and the current density per unit radiation angle increase, the focused beam current increases, providing high speed etching. As the source diameter and the energy spread decrease, the focused beam is finer, providing highly accurate etching. As typical examples, the duoplasmatron ion source is used for high speed etching in an area of 10 to 100 μm square, the liquid metal ion source is used for etching in an area of 0.1 to 10 μm square, and the field ionization ion source is used for highly accurate etching in an area of less than 0.1 μm square.

iii) Etching process (1)

Figure 6:
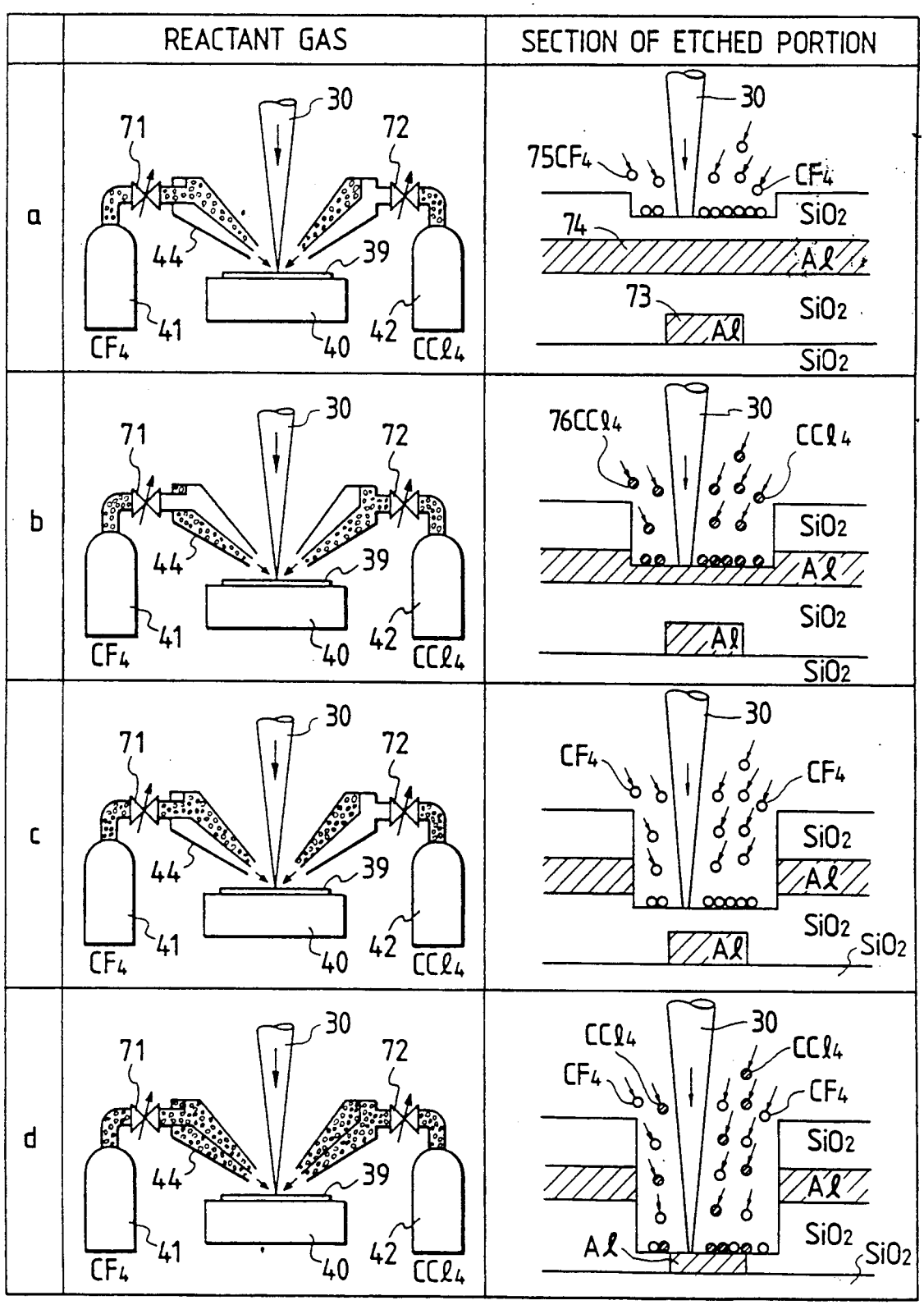

FIGS. 6 and 7 show the principle of the multilayered LSI etching method of this invention. FIG. 6 shows an example in which the method to irradiate a focused energy beam onto a workpiece in the reactant gas atmosphere and to perform reactive etching only on the beam irradiated part is used. The section of each etched portion is shown on the right. Let's assume that wider upper Al conductor layer 74 covers overall lower Al conductor layer 73 via a layer boundary film, etching is performed sequentially starting with the uppermost layer of $SiO_2$, and lower layer conductor Al 73 is cut. Simultaneously with the start of etching, CF gas is supplied from etching gas cylinder 41 via flow rate adjusting valve 71 into nozzle 44 as shown in FIG. 6a, and sprayed onto sample 39. Simultaneously, ion beam 30 is focused and irradiated onto the sample to perform locally reactive etching. Reactant gases which can be used to selectively etch $SiO_2$ against Al are F series gases such as $F_2$, $BF_3$, $PF_3$, $CF_4$, $SF_6$, etc. The end of etching of the uppermost layer of $SiO_2$ is detected, flow rate adjusting valve 71 is closed as shown in FIG. 6b, flow rate adjusting valve 72 is opened, the reactant gas to be sprayed onto sample 39 from nozzle 44 is changed from $CF_4$ to $CCl_4$, and upper layer Al conductor 74 is etched. Reactant gases which can be used to selectively etch Al against $SiO_2$ are mainly Cl series gases such as $Cl_2$, $BCl_3$, $PCl_3$, $CCl_4$, $SiCl_4$, etc. The end of etching of upper layer Al conductor 74 is detected, flow rate adjusting valve 72 is closed as shown in FIG. 6c, flow rate adjusting valve 71 is opened, the reactant gas to be sprayed onto sample 39 from nozzle 44 is changed from $CCl_4$ to $CF_4$, and the $SiO_2$ film, which is a layer boundary film, is etched. After the end of etching of the $SiO_2$ film (lower layer Al conductor 73 is exposed) is detected, flow rate adjusting valve 72 is opened as shown in FIG. 6d, and $CF_4$ and $CCl_4$ are sprayed concurrently onto sample 39 from nozzle 44 for etching. Lower layer Al conductor 73, which is exposed on the etching surface, and the layer boundary films of $SiO_2$ on both sides of the conductor are etched reactively, and lower layer Al conductor 73 can be cut at a higher yield rate. In this case, the lower layers of $SiO_2$ cannot be selective in etching. To minimize damage to the lower layers, close flow rate adjusting valve 71 when lower layer Al conductor 73 is being etched, and switch the reactant gas only to $CCl_4$ and etch selectively only lower layer Al conductor 73. When more than one workpiece exist on the etching surface as shown in FIG. 6d, the corresponding reactant gases can be sprayed concurrently on the workpieces for etching. Controlling the flow rate of each reactant gas permits each workpiece etching speed to be controlled and provides etching by controlling the shape of each workpiece. To etch a window, for example, on the sample shown in FIG. 6, through which lower layer Al conductor 73 is to be exposed, to connect a CVD conductor to it, by spraying only $CF_4$ to the sample in FIG. 6d as a reactant gas, the layer boundary films of $SiO_2$ on both sides of Al conductor 73 can be selectively etched to expose the side of Al conductor 73 and to widen the contact area In FIG. 6, reference numeral 30 designates an ion beam, 40 a stage, 42 an etching gas cylinder, 75 a $CF_4$ molecule, and 76 a $CCl_4$ molecule.

FIG. 7 shows an example in which a reactive beam is used for the etching in FIG. 6. In the example, the duoplasmatron ion source or the field ionization gas ion source is used as an ion source, and the reactant gas to be ionized is switched according to the layer to be etched. The reactant gas is to be switched for each etching in the same way as in FIG. 6. When etching the uppermost layer of $SiO_2$, reactive beam 77 of ionized $CF_4$ gas ($CF_3+$ ions are main ions) is used. When upper layer Al conductor 74 starts etching, the reactant gas is switched to reactive beam 78 of ionized $CCl_4$ gas ($CCl_3+$ ions are main ions). To etch layer boundary films of $SiO_2$, hereafter, reactive beam 77 of ionized CF gas is used. To cut lower layer Al conductor 73, reactive beam 79 of ionized gases of $CF_4$ and $CCl_4$ is used. By controlling the mixing ratio of $CF_4$ and $CCl_4$ to be supplied into the ion source unit in FIG. 7d, the ratio of the numbers of ions of the reactant gases in reactive beam 79 can be controlled and the etching speeds of the layer boundary film of $SiO_2$ film and of lower layer Al conductor 73 can be controlled. To switch the reactive beam in FIG. 7, the mass separator (for example, an EXB mass filter) installed in the ion optical system, which is not shown in FIG. 1, can be used. By doing this, a mixture of $CF_4$ and $CCl_4$ gases is always supplied into the ion source unit as a reactant gas, and a mixed reactive beam containing both gases can be extracted. The $CF_3+$ or $CCl_3+$ beam can be separated from the mixed reactive beam by the mass separator to etch layers.

Reference numerals 31, 32, 61, and 62 in FIG. 7 designate the same as those in FIG. 5.

Figure 8A:
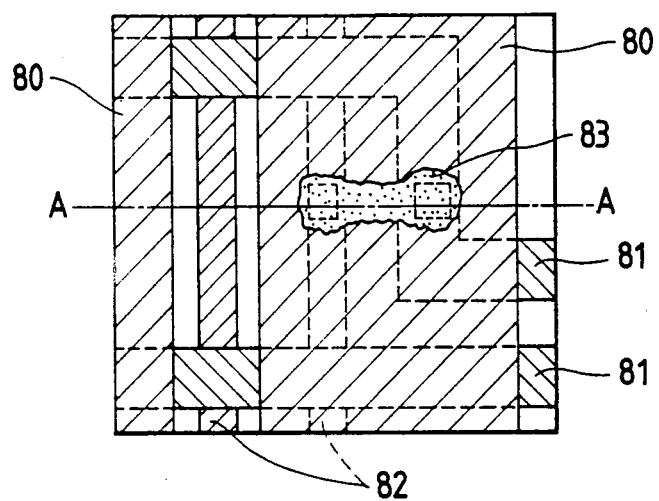
FIGS. 8a and 8b show the schematic diagrams of problems on multilayered LSI conductor connection.

FIGS. 8a to 10 show the effects of this invention on conductor repair of multilayered LSIs. FIGS. 8a and 8b show examples of conductor repair. The section in FIG. 8b, which is the AA section in FIG. 8a, shows that LSIs have a multilayer structure at present due to high integration, such that the uppermost layer contains a power supply conductor and the lower layers contain signal conductors. The power supply conductor is designed as wide as possible to ensure the current capacity, and covers almost overall the surface of each LSI FIG. 8b shows that, to repair a device by connecting the signal conductors on the lower layers to each other using locally formed films, a contact hole should be provided in upper layer 80. Such conductor connections may cause the upper and lower conductors to be short-circuited by CVD conductor 83, resulting in an abnormal operation of the device. The simplest means to prevent it is to etch a large hole in upper layer conductor 80 covering the lower layer conductors to be connected to each other.

Figure 8B:
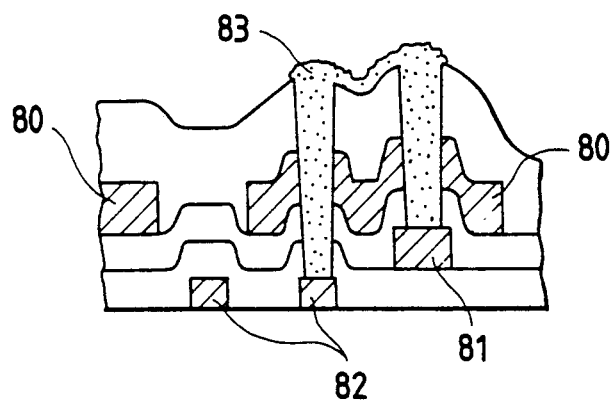

Reference numerals 81 and 82 in FIGS. 8a and 8b designate lower layer conductors.

Figure 9:
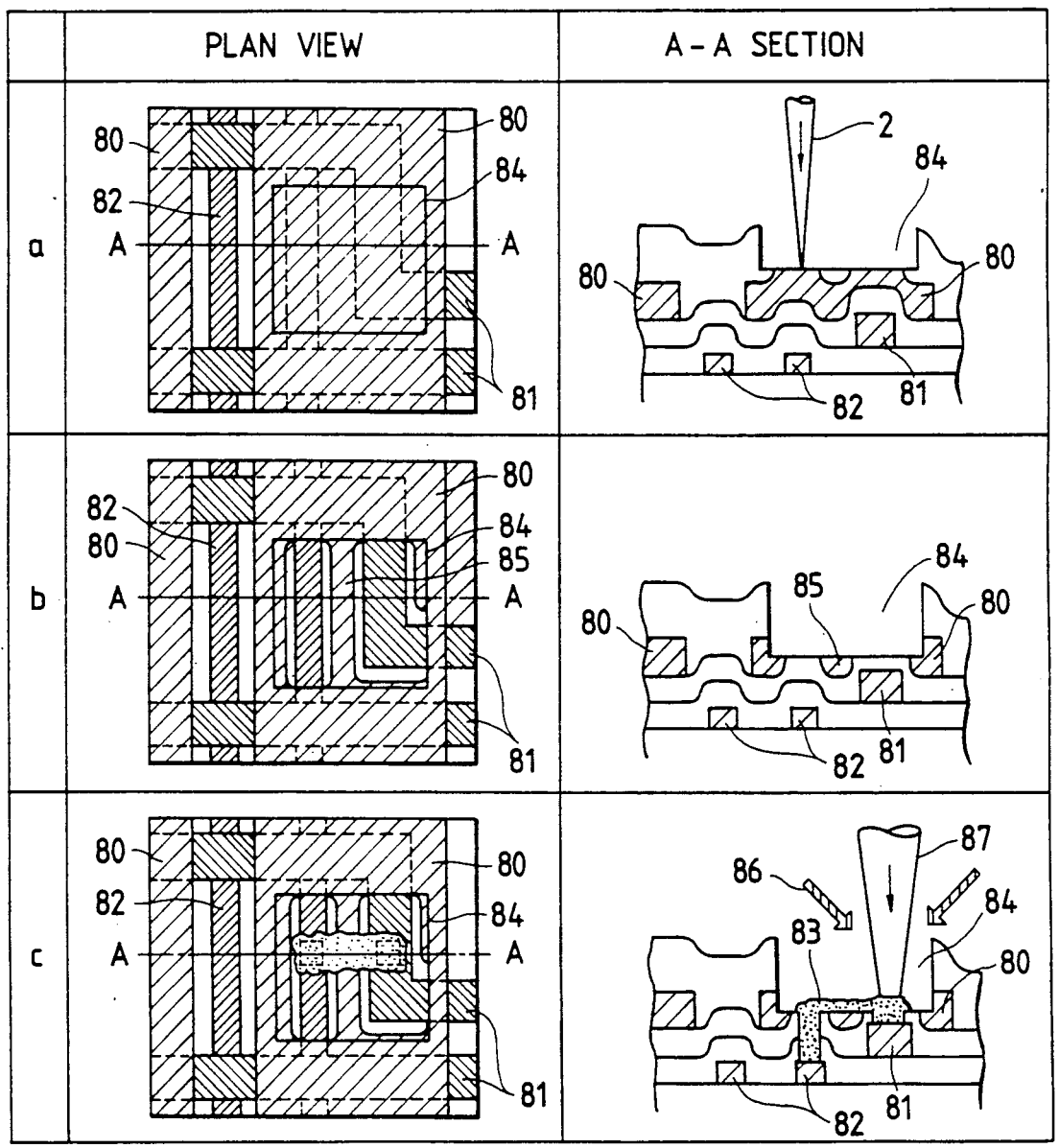
FIG. 9 shows a multilayered LSI etching example by the conventional method.

FIG. 9 shows an example in which a large hole is etched in the upper layer conductor by the conventional sputtering etching method and the lower layer conductors are connected to each other. FIG. 9a shows that a large hole is etched in upper layer conductor 80 above the connection portions, and FIG. 9b shows that the hole etching is stopped just above lower layer conductor 81 to be connected to prevent it from damage. FIG. 9c shows that laser beam 87 is irradiated to form CVD conductor 83 by supplying CVD gas 86 and the lower layer conductors are connected to each other. When the conventional sputtering etching method is used, as the tilt angle of an etching surface increases, the etching speed increases and the bottom of the etched hole is flattened. FIG. 9 shows that the bottom of the etched hole is flat.

In the case of multilayered LSIs, the upper layer boundary insulating films and Al conductors are greatly undulated due to the uneven lower layer conductors. Consequently, even if the hole etching is stopped at the limit depth to prevent lower layer conductor 81 from damage, unetched portion 85 of upper layer conductor 80 remains at the bottom of the hole in a bridge form. When CVD conductor 83 is formed, the upper and lower conductors are short-circuited via unetched portion 85, and the device cannot be normally operated in the same way as that in FIG. 8.

In FIG. 9, reference numeral 2 designates an ion beam, 82 a lower layer conductor, and 84 an etched hole.

Figure 10:
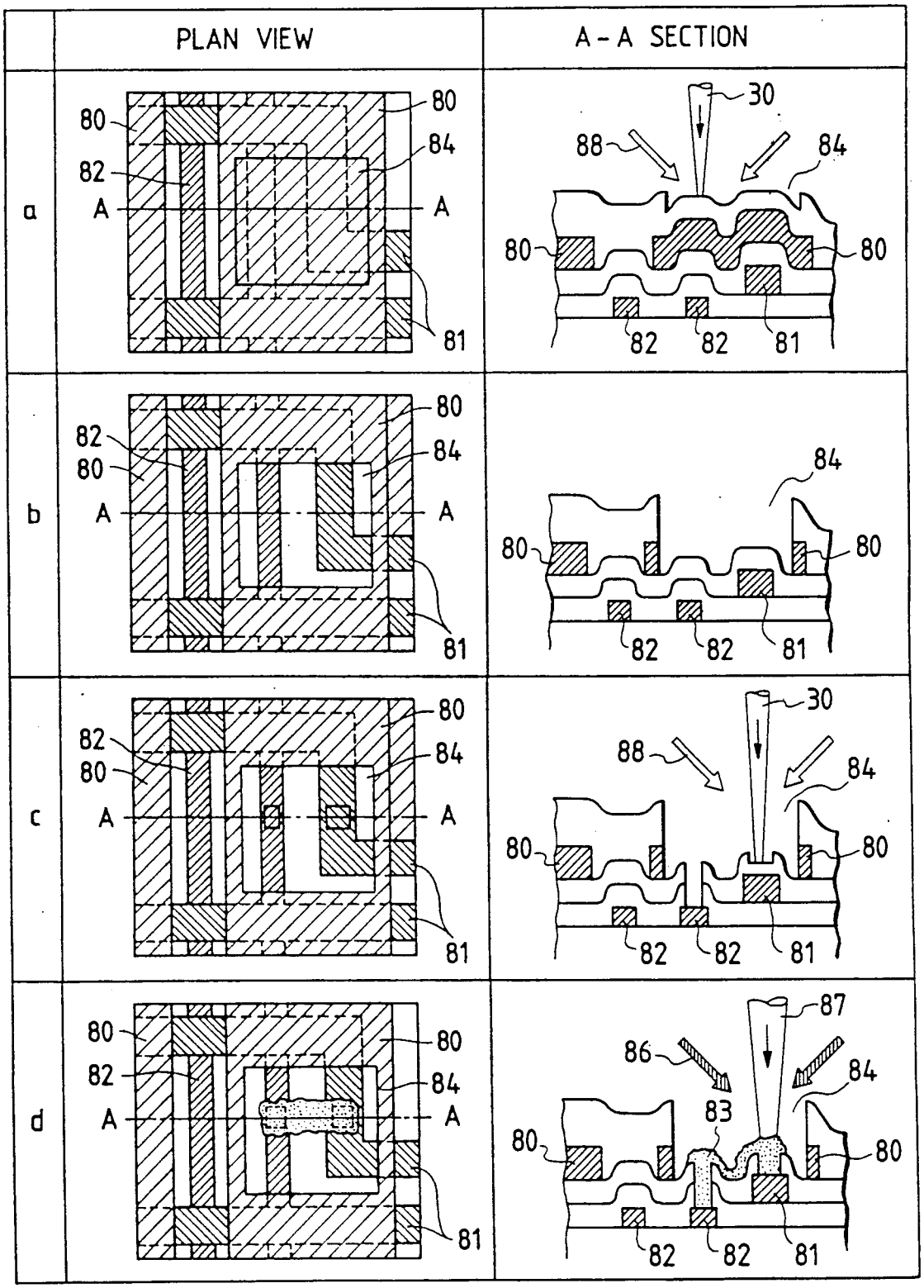
FIG. 10 shows a multilayered LSI etching example by the present invention.

FIG. 10 show an example in which the etching method in FIG. 9 is replaced with that of this invention. FIGS. 10a and 10b show that ion beam 30 is irradiated onto the uppermost insulating film and upper layer conductor 80 by supplying the etching gas corresponding to each layer, and a large hole is etched by the locally reactive etching method. FIG. 10c shows that a contact hole is etched in the lower layer conductors to be connected to each other by the locally reactive etching method. FIG. 10d shows that CVD conductor 83 is formed in the same way as with FIG. 9, and the lower layer conductors are connected to each other. The locally reactive etching method of this invention permits highly selective etching of the lower layers because the etching proceeds generally by chemical reaction. In FIG. 10b, accurate etching along the uneven layers can be done, and no unetched portion, such as that shown in FIG. 9, remains on the upper layer conductors. The contact hole in FIG. 10c can be perfectly etched without causing damage to the lower layer conductors, providing high reliability of connection.

In FIG. 10, reference numeral 84 designates an etched hole, 86 a CVD gas, 87 a laser beam, and 88 an etching gas.

Figure 11:
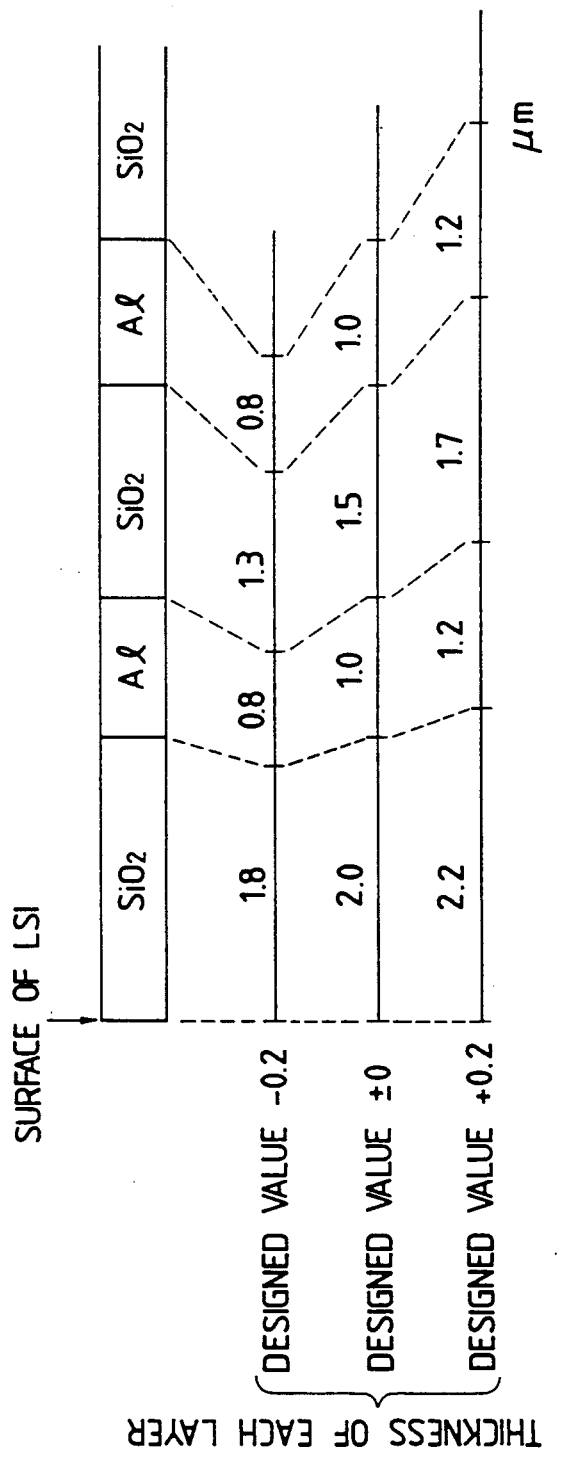
FIG. 11 shows an example of variations in multilayered LSI film thickness.
Figure 12:
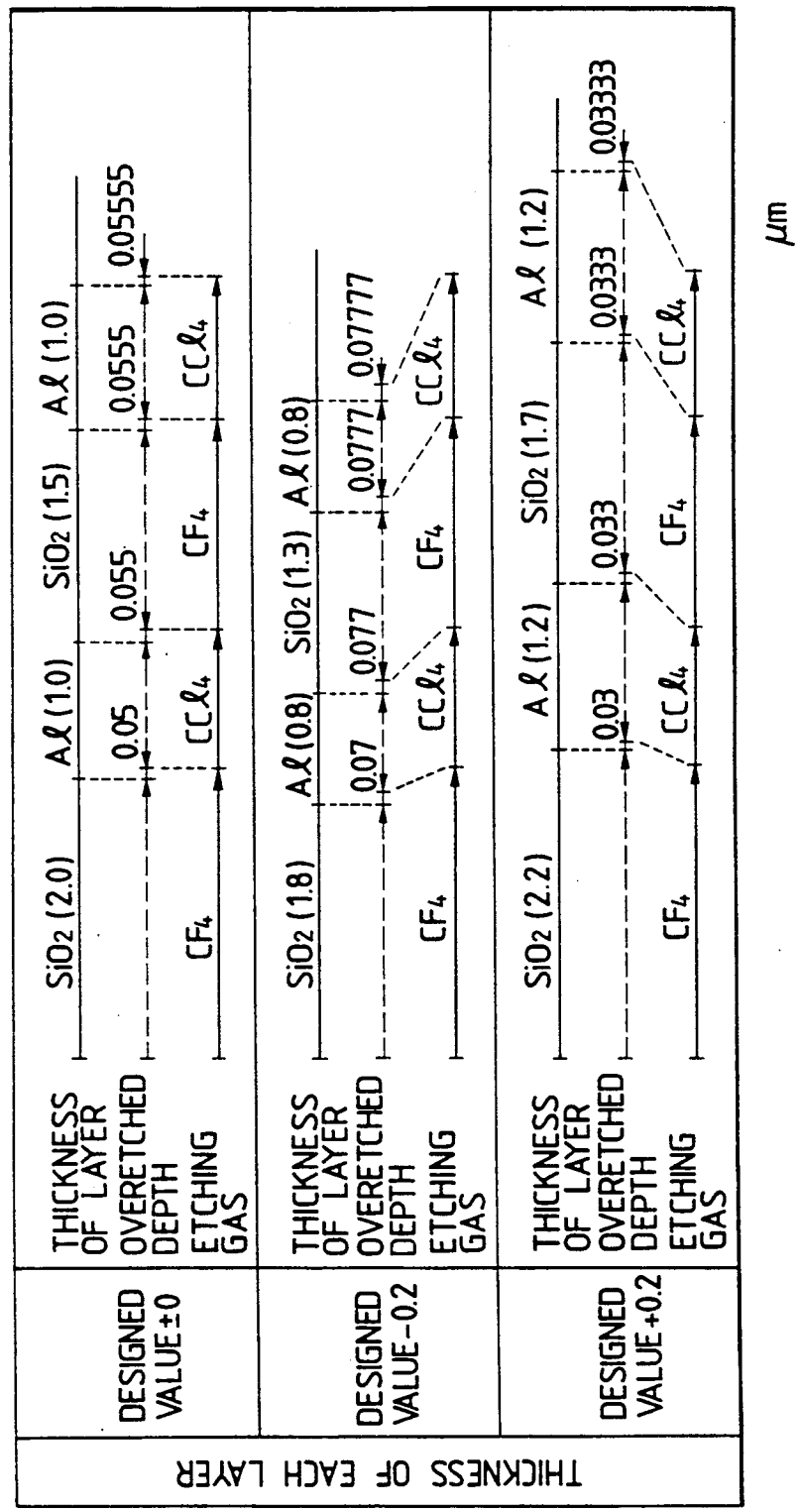
FIG. 12 shows an effect of highly selective etching of multilayered LSIs.

FIGS. 11 and 12 show the effects of this invention on highly selective etching of multilayered LSIs. In the case of multilayered LSIs, the film quality and thickness of each layer depend on variations in the production process conditions or in the surface status of each wafer. FIG. 11 shows an example of variations in the film thickness of a multilayered LSI. The layers are $SiO_2$, Al, $SiO_2$, Al, and $SiO_2$ sequentially from the uppermost one. The designed thickness of each layer is 2.0 $\mu$m, 1.0 $\mu$m, 1.5 $\mu$m, and 1.0 $\mu$m. The maximum thickness variation of each layer is ±0.2 $\mu$m in consideration of all the variation causes, resulting in a total variation of about ±1.0 $\mu$m as shown in FIG. 11 when all the layers are stacked. Therefore, when the conventional sputtering etching method, by which each layer is etched at almost a constant speed, is used, the etched depth of each layer should be exactly monitored. FIG. 12 shows variations in the overetched depth of each layer when the highly selective etching method of this invention is used for the LSI in FIG. 11. In this example, the etching gas is switched in the same timing at each layer thickness such as the designed thickness (designed value ±0 $\mu$m), the minimum thickness (designed value −0.2 $\mu$m), or the maximum thickness (designed value +0.2 $\mu$m). The selection ratio of Al to $SiO_2$ when a Cl series gas is used is 10:1, and that of $SiO_2$ to Al when an F series gas is used is nearly 10:1. To simplify calculations of overetched depth in FIG. 12, the selection ratio of $SiO_2$ to Al when $CF_4$ gas is used and that of Al to $SiO_2$ when $CCl_4$ gas is used are set to 10:1. The etching gas is switched, in FIG. 12, in timing of 0.5 $\mu$m over-etching for each layer to complete each etching. When the layer thickness is "the designed value ±0 $\mu$m", the $CF_4$ gas is used until the uppermost layer of $SiO_2$ is overetched 0.5 $\mu$m. When the upper layer Al conductor starts etching, however, the etching speed is reduced to 1/10 of the previous one due to selectivity, resulting in an actually overetched depth of 0.05 $\mu$m. The etching gas is switched to $CCl_4$ to etch the upper layer Al conductor. The $CCl_4$ gas is used until the upper layer Al conductor is overetched 0.55 $\mu$m, which is the sum of the overetched depth 0.05 um of the $SiO_2$ film and the preset depth 0.5 $\mu$m. When the layer boundary film of $SiO_2$ starts etching, however, the etching speed is reduced to 1/10 of the previous one due to selectivity, resulting in an actually overetched depth of 0.055 $\mu$m. The actually overetched depth of each subsequent layer is 0.0555 $\mu$m and 0.0555 $\mu$m as shown in FIG. 12. When the thickness of each layer is "the designed value −0.2 $\mu$m", the $CF_4$ gas is used until the uppermost layer of $SiO_2$ is overetched 0.7 $\mu$m, which is the sum of the preset overetched depth 0.5 $\mu$m and the deficient film thickness 0.2 $\mu$m. When the upper layer Al conductor starts etching, however, the etching speed is reduced to 1/10 of the previous one due to selectivity, resulting in an actually overetched depth of 0.07 $\mu$m. The actually overetched depth of each subsequent layer, which is calculated in the same way as with the thickness of each layer being "the designed value ±0 $\mu$m", is 0.077 $\mu$m, 0.0777 $\mu$m, and 0.07777 $\mu$m as shown in FIG. 12. When the thickness of each layer is "the designed value +0.2 $\mu$m", the $CF_4$ gas is used until the uppermost layer of $SiO_2$ is overetched 0.3 $\mu$m, which is the difference between the preset overetched depth 0.5 $\mu$m and the surplus film thickness 0.2 $\mu$m. When the upper layer Al conductor starts etching, however, the etching speed is reduced to 1/10 of the previous one due to selectivity, resulting in an actually overetched depth of 0.03 $\mu$m. The actually overetched depth of each subsequent layer is 0.033 $\mu$m, 0.0333 $\mu$m, and 0.03333 $\mu$m as shown in FIG. 12. As a result, the locally reactive etching method of this invention with the gas switched provides selective etching (for example, at a selection ratio of 10:1) of each layer of multilayered LSIs for the lower layers. As shown in FIG. 12, therefore, each layer, with a maximum thickness variation of +0.2 $\mu$m, of multilayered LSIs can be etched highly accurately at an overetched depth of less than 0.1 $\mu$m. In this case, the gas switching timing can be set to one value based on the designed film thickness.

The thickness of each layer of current multilayered LSIs is about 1 $\mu$m and an etched depth accuracy of about 0.1 $\mu$m can be obtained by this invention in the specified gas switching timing, so that there is no need to monitor the etched depth and the etching status. As the device integration increases much more in the future, the vertical structure will be highly densed and each layer will be thinner. For that purpose, the etched depth should be controlled more accurately and each layer boundary should be detected more exactly.

iv) Detection of layer boundary

An embodiment, in which an optical detection means (a light microscope or a laser interferometer) is used to detect each layer boundary, is indicated below. For etching (for example, etching a hole in upper layer Al conductor 80 in FIG. 10) in a wide area of each surface including the conductor pattern, a light microscope is used to detect each layer boundary. The etching can be done by monitoring light microscope images of the portion to be etched, and a change in the layer can be detected by a change in the pattern of light microscope images of the surface to be etched. For etching in a narrow area (the area width is close to the conductor width) (for example, etching contact holes in lower layer Al conductors 81 and 82), a laser interferometer is used. The etching can be done by monitoring the etched depth by the laser interferometer, and each layer boundary can be detected by a change in the etched depth. FIGS. 13 to 19 show the monitoring method for the etched depth by the laser interferometer.

Figure 13:
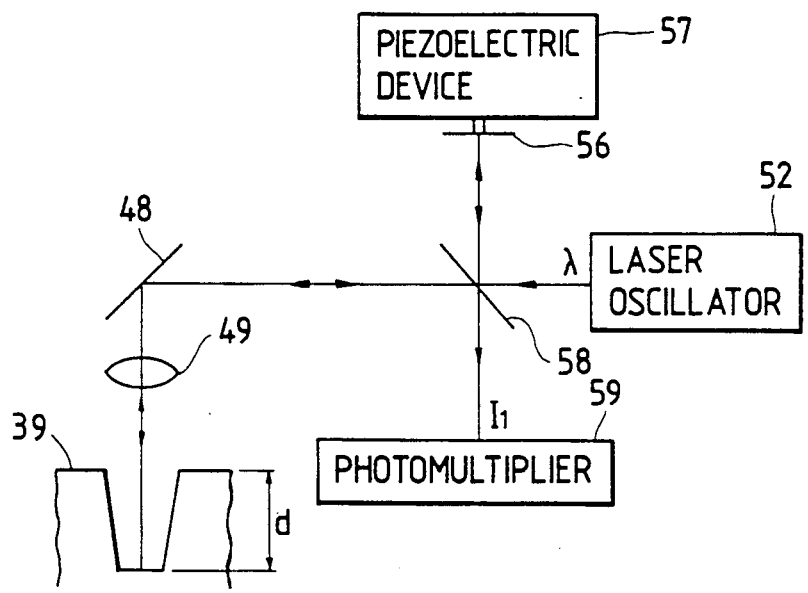
FIG. 13 shows the principle schematic diagram of depth measurement by light interference.

FIG. 13 shows the schematic diagram of an interferometer using a laser beam of single wavelength The laser beam to be irradiated onto sample 39 is reflected off and returned from the bottom of the etched hole as shown in FIG. 13. The optical path difference between the two reflected beams from the etched hole bottom and reflecting mirror 56 varies because the reflecting surface of the etched hole bottom moves backward as the etching proceeds, and the interference light intensity varies. By measuring changes in the interference light intensity by photomultiplier 59 and monitoring the optical path difference between the two beams, the depth of the etched hole bottom can be determined. When the selected material of beam splitter 58 is equal in transmittance and reflectance, the amplitudes of the two beams, which are introduced into photomultiplier 59, are proportional to the reflectances of sample 39 and reflecting mirror 56 respectively. Assuming that the reflectances of sample 39 and reflecting mirror 56 are r and 1, for example, the amplitudes of the two beams can be expressed by $ra_0$ and $a_0$ when they are introduced into photomultiplier 59. Assuming the amplitude of the laser beam immediately after it is generated from laser oscillator 52 as $4a_0$, it is divided into two laser beams $2a_0$ in amplitude after it passes through beam splitter 58. The transmitted light is reflected off of sample 39, changed in amplitude from $2a_0$ to $2ra_0$, reflected off of beam splitter 58 once again, changed in amplitude from $2ra_0$ to $ra_0$, then enters photomultiplier 59. Another beam is reflected off of reflecting mirror 56, transmitted through beam splitter 58 once again with the amplitude $2a_0$ unchanged, changed in amplitude from $2a_0$ to $a_0$, then enters photomultiplier 59.

Assuming the phase difference between the two beams as $\delta$, the amplitude ($a_1$) of the interference light is expressed as follows:

$$a_1 = ra_0 e^{i\delta} \tag{1}$$

Adjust the location of reflecting mirror 56 finely so that the interference light intensity is maximized ($\delta = 0$) when the etching starts. The phase difference $\delta$ can be expressed by the equation indicated below using the etched depth d.

$$\delta = \frac{2d}{\lambda} \cdot 2\pi \tag{2}$$

The interference light intensity $I_1$ can be expressed by the equation indicated below using Equations (1) and (2).

$$I_1 = |a_1|^2 \tag{3}$$
$$= a_0^2 \left( 1 + r^2 + 2r\cos\frac{4d}{\lambda}\pi \right)$$

Figure 14:
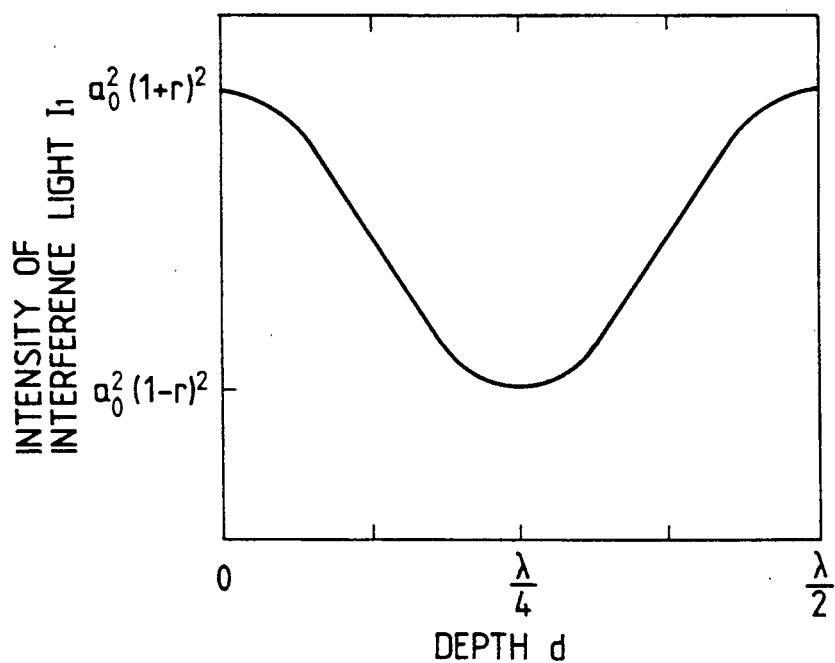
FIG. 14 shows an example of the relation between depth and interference light intensity.

For etching Al conductors or Si substrates of LSIs, the reflectance r can be considered to be almost constant. If this occurs, r in Equation (3) is constant, and the interference light intensity $I_1$ varies with the etched depth d as shown in FIG. 14. Therefore, by checking changes in the interference light intensity $I_1$ after the etching starts, the etched depth d can be monitored from the relation in FIG. 14. Or, by moving reflecting mirror 56 so that the interference light intensity $I_1$ is kept at its maximum value or the reflecting surface does not move backward as the etching of sample 39 proceeds, the etched depth d can be directly read from the movement distance of reflecting mirror 56, which is connected to piezoelectric device 57. Piezoelectric device 57 to be used to move reflecting mirror 56 finely produces a stroke depending on the applied voltage as well known, and the resolution of the movement distance for all the strokes is about 1/1000. When the etching depth is assumed as 20 μm, the depth reading accuracy is 0.02 μm, and this is a sufficient accuracy.

Piezoelectric device 57 is to be driven by a voltage applied by a voltage application unit which is not shown in the figure.

When an insulating layer of $SiO_2$ of LSIs is to be etched, the beam irradiated onto sample 39 is subject to multiple interference by the $SiO_2$ film. In this case, the reflectance r varies with the $SiO_2$ film thickness or the etched depth, hence r cannot be handled as a constant. As a result, changes in the interference light intensity Il when the depth is monitored by the interference as mentioned above are complicated, causing a possible reduction in the monitoring accuracy. To improve the monitoring accuracy, it is recommended to measure only the reflected light intensity from sample 39 and to monitor the etched depth by using changes in the reflected light intensity caused by changes in the $SiO_2$ film thickness. In this embodiment, by cutting off the reflected light from reflecting mirror 56 with a light absorber which is not shown in FIGS. 1 and 13, the measurement mode for the reflected light intensity from sample 39 can be easily selected. When $SiO_2$ and Al layers of multilayered LSIs are to be sequentially etched, the depth monitor method to measure the reflected light intensity for each layer and the interference light intensity can be selected to provide accurate depth monitoring on the whole. The depth monitoring method by measurement of the reflected light intensity for $SiO_2$ will be described later.

In FIG. 13, reference numeral 48 designates a reflecting mirror and 49 a reflecting objective.

Figure 15:
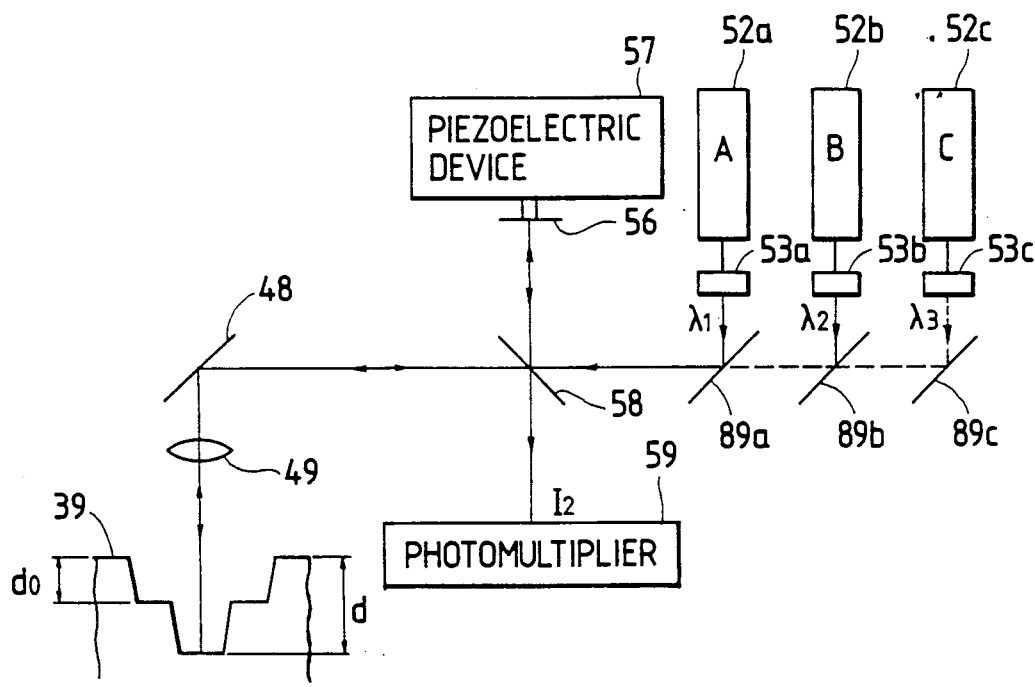
FIG. 15 shows the principle schematic diagram of depth measurement by interference of light with several wavelengths.
Figure 16:
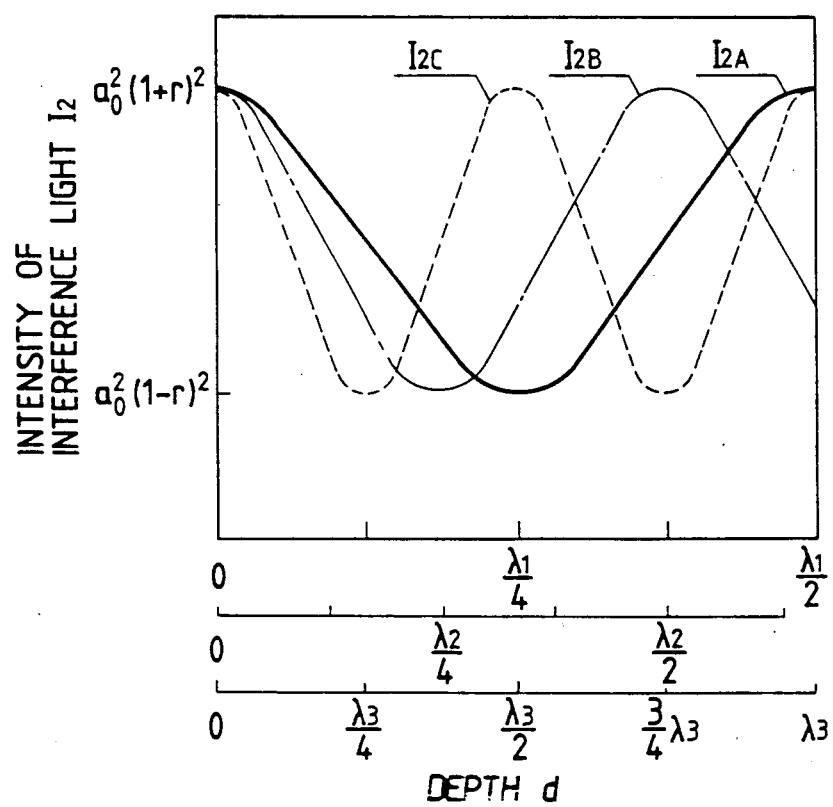
FIG. 16 shows an example of the relation between depth and interference light (with several lengths) intensity.

FIGS. 15 and 16 show the depth monitoring method by measurement of the interference light intensity using a laser beam with several wavelengths. The configuration of the interferometer unit in FIG. 15 is the same as that in FIG. 13. The irradiation light oscillator unit is structured so that the laser beam, $\lambda_1$, $\lambda_2$ or $\lambda_3$ in wavelength oscillated from the laser oscillator A 52a, B 52b, or C 52c is turned on or off by the shutter 53a, 53b, or 53c to be used for irradiation. Each laser beam mentioned above is used to measure the interference light intensity $I_2$. FIG. 16 shows changes in $I_2$ with the etched depth d when the reflectance r of sample 39 is constant (Al or Si is to be etched). Assuming the interference light intensities when the laser oscillators A, B, and C are used as $I_{2A}$, $I_{2B}$, and $I_{2C}$, they are shown in FIG. 16 by a solid line, an alternate long and short dash line, and a dotted line. The change in each interference light intensity is the same as that in FIG. 14, and the change cycle is ½ of the wavelength. However, $I_{2A}$, $I_{2B}$, and $I_{2C}$ are changed as the depth d increases because the wavelengths ($\lambda_1$, $\lambda_2$, and $\lambda_3$) are different from each other. When the blue Ar laser beam, green Ar laser beam, and He-Ne laser beam oscillated from the laser oscillators A, B, and C are used, for example, $\lambda_1=488$ nm, $\lambda_2=515$ nm, and $\lambda_3=633$ nm. And, $I_{2A}$, $I_{2B}$, and $I_{2C}$ agree with each other theoretically once again when the depth d is about 5 mm. In actual etching (d≦several tens μm), $I_{2A}$, $I_{2B}$, and $I_{2C}$ will not agree with each other once again. Therefore, by measuring the three interference light intensities $I_{2A}$, $I_{2B}$, and $I_{2C}$, the depth d at that time can be determined from the relation in FIG. 16.

When multietching is to be done on one sample in the case of the depth monitor by the interferometer using a single-wavelength laser beam in FIG. 13, the initial value should be adjusted before each etching starts so that the interference light intensity is maximized. In the case of the depth monitor by the interferometer using a laser beam of several wavelengths in FIG. 15, the three interference light intensities should be adjusted once so that they are maximized at the reference height. When each etching starts, the relative height of the etching start surface for the reference height can be determined from $I_{2A}$, $I_{2B}$, and $I_{2C}$, and the etching up to the specified depth can be monitored employing the relation of FIG. 16. The depth monitor using a laser beam of several wavelengths is useful in multistage etching such as the etched hole in sample 39 in FIG. 15.

In FIG. 15, reference numeral 48 designates a reflecting mirror, 49 a reflecting objective, 56 a reflecting mirror, 57 a piezoelectric device, 58 a beam splitter, 59 a photomultiplier, and 89a to 89c half mirrors.

Descriptions of the etched depth monitor using measurement of the reflected light intensity for a material, the reflectance r of which varies with etching, follow. When a beam is irradiated onto a transparent insulating film ($SiO_2$, etc.) of an LSI, for example, the beam is subject to multiple interference and the reflected light intensity varies with the film thickness. When etching insulating films of multilayered LSIs, the etched depth can be monitored by irradiating a focused laser beam onto each etched hole bottom simultaneously with etching and by detecting a change in the insulating film thickness as a change in the reflected light intensity.

Figure 17:
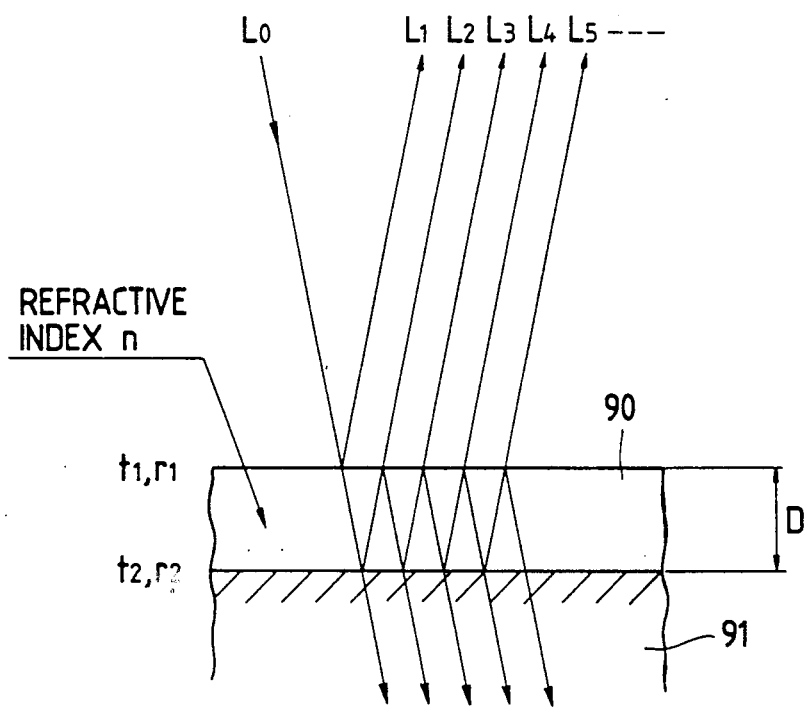
FIG. 17 shows the schematic diagram of repetitive reflection and interference.

FIG. 17 shows a schematic diagram of light multiple interference by a transparent film. In the example, the sample is a LSI and a thin film of transparent insulating layer 90 is formed on Al conductor 91. Incoming light $L_o$ is reflected between the top and bottom of insulating layer 90 with film thickness D repeatedly to produce the 1st, 2nd, 3rd,---reflected beams $L_1$, $L_2$, $L_3$, ---. The interference light intensity of all the reflected beams ($L_1$, $L_2$, $L_3$, ---) is detected as an actual reflected light intensity. Assuming that the transmittance and reflectance from the vacuum to insulating layer 90 are t1 and r1, the transmittance and reflectance from insulating layer 90 to Al conductor 91 are t2 and r2, the transmittance and reflectance from insulating layer 90 to the vacuum are t1' and r1', the amplitude of incoming light $L_o$ is $a_0$, the phase difference between adjacent reflected beams (for example, $L_1$ and $L_2$) is δ, and the absorptance of insulating layer 90 is α, the amplitude $a_3$ of the repetitively reflected and interfered light is expressed as follows ($L_1$, $L_2$, $L_3$, ... are added):

$$a_3 = a_0 r_1 + a_0 t_1 t_1' r_2 e^{-2\alpha D} e^{i\delta} + a_0 t_1 t_1' r_1' r_2^2 e^{-4\alpha D} e^{i2\delta} + \ldots \quad (4)$$

$$= \frac{a_0 (r_1 + r_2 e^{-2\alpha D} e^{i\delta})}{1 + r_1 r_2 e^{-2\alpha D} e^{i\delta}}$$

where $r_1' = -r_1$ and $t_1 t_1' = 1 - r_1^2$.

where $r_1' = -r_1$ and $t_1 t_1' = 1 - r_1^2$.
The phase difference δ can be expressed by the equation indicated below using the wavelength λ, the film thickness D of insulating layer 90, and the refractive index n.

$$\delta = \frac{2nD}{\lambda} \cdot 2\pi \quad (5)$$

The repetitively reflected and interfered light intensity $I_3$ is expressed by the equation indicated below using Equations (4) and (5):

$$I_3 = |a_3|^2 \quad (6)$$

$$= a_0^2 \frac{r_1^2 + r_2^2 e^{-4\alpha D} + 2r_1 r_2 e^{-2\alpha D} \cos\frac{4nD}{\lambda}\pi}{1 + r_1^2 r_2^2 e^{-4\alpha D} + 2r_1 r_2 e^{-2\alpha D} \cos\frac{4nD}{\lambda}\pi}$$

Figure 18:
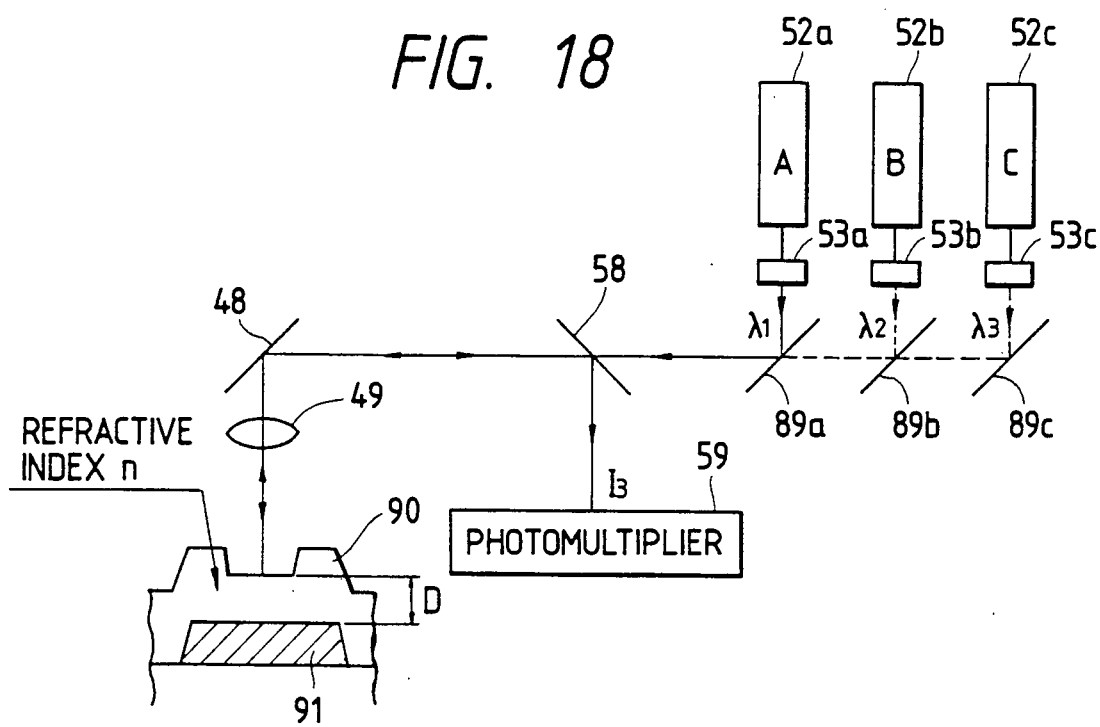
FIG. 18 shows the principle schematic diagram of film thickness measurement by repetitive reflection and interference.
Figure 19:
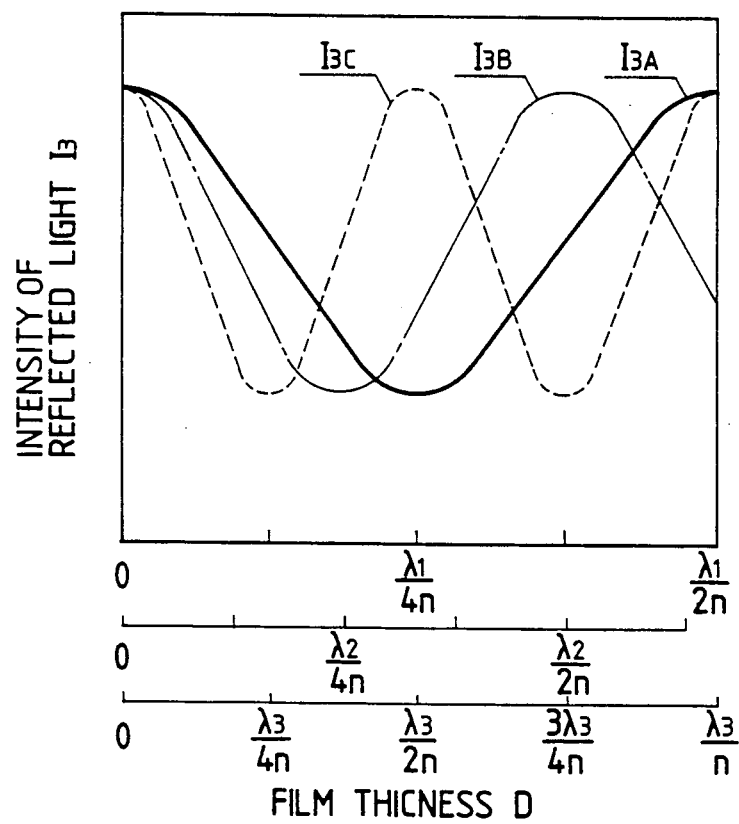
FIG. 19 shows an example of the relation between film thickness and repetitive reflection and interference light intensity.

FIG. 18 shows a schematic diagram of the configuration of equipment to monitor the depth by measurement of the reflected light intensity. The laser beam $\lambda_1$, $\lambda_2$, or $\lambda_3$ in wavelength oscillated from the laser oscillator A 52a, B 52b, or C 52c is turned on or off by the shutter 53a, 53b, or 53c to be used for irradiation. Each laser beam mentioned above is used to measure the reflected light intensity $I_3$. When the sample is a LSI, $\alpha \approx 0$ in Equation (6). FIG. 19 shows changes in $I_3$ with the film thickness D, in general. Assuming the reflected light intensities when the laser oscillators A, B, and C are used as $I_{3A}$, $I_{3B}$, and $I_{3C}$, they are shown in FIG. 19 by a solid line, an alternate long and short dash line, and a dotted line. Each reflected light intensity is changed in a cycle of ½n of the wavelength but varies with the film thickness D because the three wavelengths are different from each other. Within the film thickness range of actual LSIs, $I_{3A}$, $I_{3B}$, and $I_{3C}$ will not agree with each other, so that, when the three reflected light intensities are measured, the insulating layer thickness can be determined from the values. In actual hole etching, the three laser beams are irradiated onto the etched hole bottom repeatedly simultaneously with etching, the film thickness D is determined from the reflected light intensities, and the etching can be done until the value for D is reduced to 0.

Reference numerals 48, 49, 58, 59, and 89a to 89c in FIG. 18 designate the same as those in FIG. 15, and numeral 90 designates a transparent insulating layer.

As mentioned above, the etched depth of multilayered LSIs can be exactly monitored by measuring the reflected light intensity for transparent films ($SiO_2$ layers, etc.) by the interferometer or by measuring the interference light intensity for opaque films (Al conductors, etc.).

Figure 20:
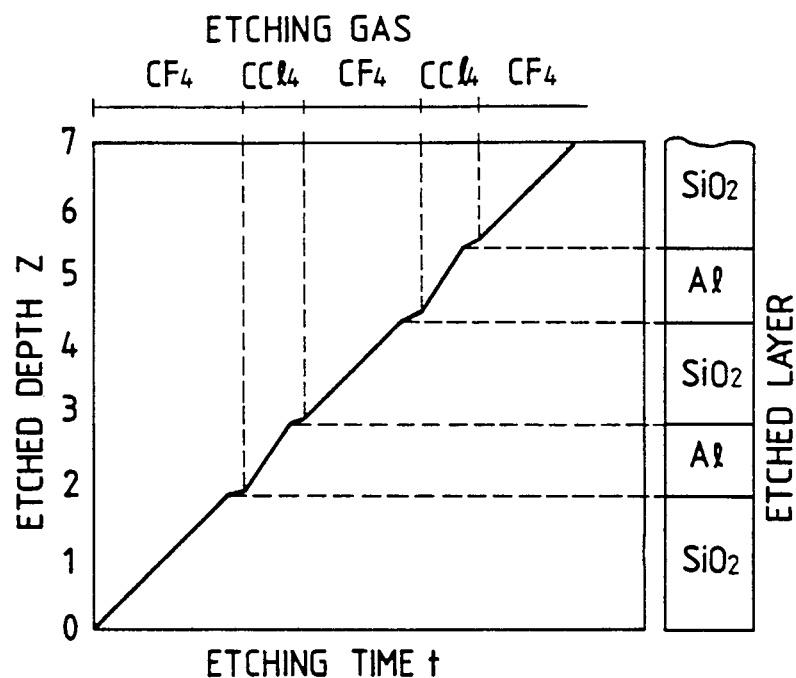
FIG. 20 shows an example of the relation between etching time and etched depth by the present invention.
Figure 21:
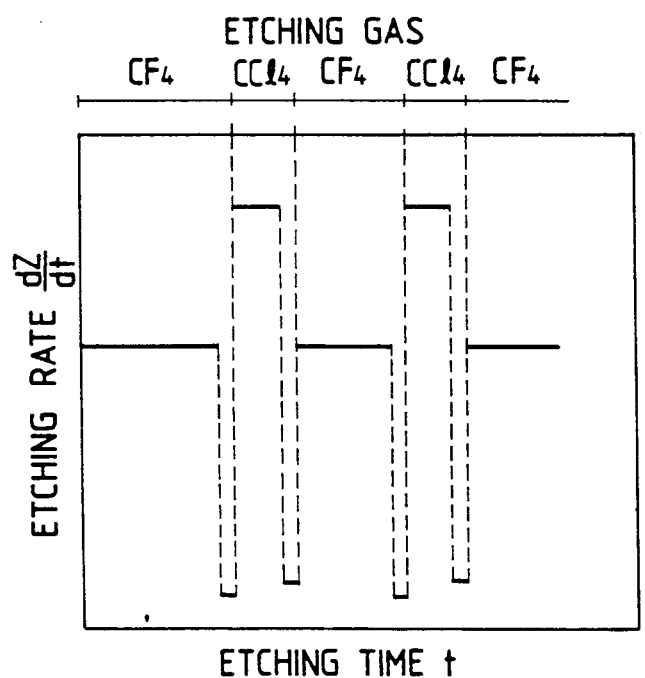
FIG. 21 shows an example of the relation between etching time and etching speed by the present invention.

FIGS. 20 and 21 show the method to detect a change in the material of a layer to be etched by using the measured change in the etched depth or the layer boundary. FIG. 20 shows an example of the relation between the etching time t and the etched depth Z of this invention. In this example, the etching gas is switched to $CF_4$, $CCl_4$, $CF_4$, $CCl_4$, and $CF_4$ sequentially for the $SiO_2$, Al, $SiO_2$, Al, and $SiO_2$ layers of a multilayered LSI starting with the upper one for locally reactive etching. Each layer is etched at almost a constant speed, and when the etching reaches the layer right under the current layer, the etching speed (the etched depth increasing rate) is reduced to about 1/10 of the current one due to selectivity. FIG. 21 shows the relation between the etching time t and the etching speed dZ/dt in the etching example in FIG. 20. The figure shows that, when the etching reaches the layer right under the current layer, dZ/dt changes greatly. Therefore, by checking a change in dZ/dt, the layer boundary can be detected, and the etching gas can be switched. A typical example is etching of an area of 5 μm by 5 μm with an ion beam of 1 nA. When $CF_4$ is used as an etching gas, the etching speeds dZ/dt of $SiO_2$ and Al are about 0.24 μm/sec and 0.032μm/sec respectively. Assuming that the sampling time at the etched depth Z is 0.2 sec and a change in the etching speed by three times of sampling at Z can be detected, the overetched depth of the uppermost layer of $SiO_2$ for the lower layer of Al is 0.02 μm. Assuming that the sampling time is 0.2 sec, the overetched depth when another layer is etched is almost the same. By taking countermeasures such as a reduction in the sampling time, this method can control the overetched depth for each layer with high precision, for example, to less than 0.01 μm. Multilayered LSIs, which require high integration in the vertical direction and a layer thickness of about a submicron in the future, will be able to be etched at a high yield rate.

By the locally reactive etching method of this invention, atoms physically sputtered from a sample during etching and reaction products (compounds of the reactant gas and atoms of the sample) are emitted. By the locally reactive etching method, the etching speed is increased to more than 10 fold of that by the sputtering etching method, and the etching proceeds generally by chemical reaction. Therefore, most emitted substances by the etching mentioned above are reaction products. The reaction products contain the elements of the etched layer, so that by detecting and analyzing the reaction products, the material of the etched layer can be detected.

Figure 22:
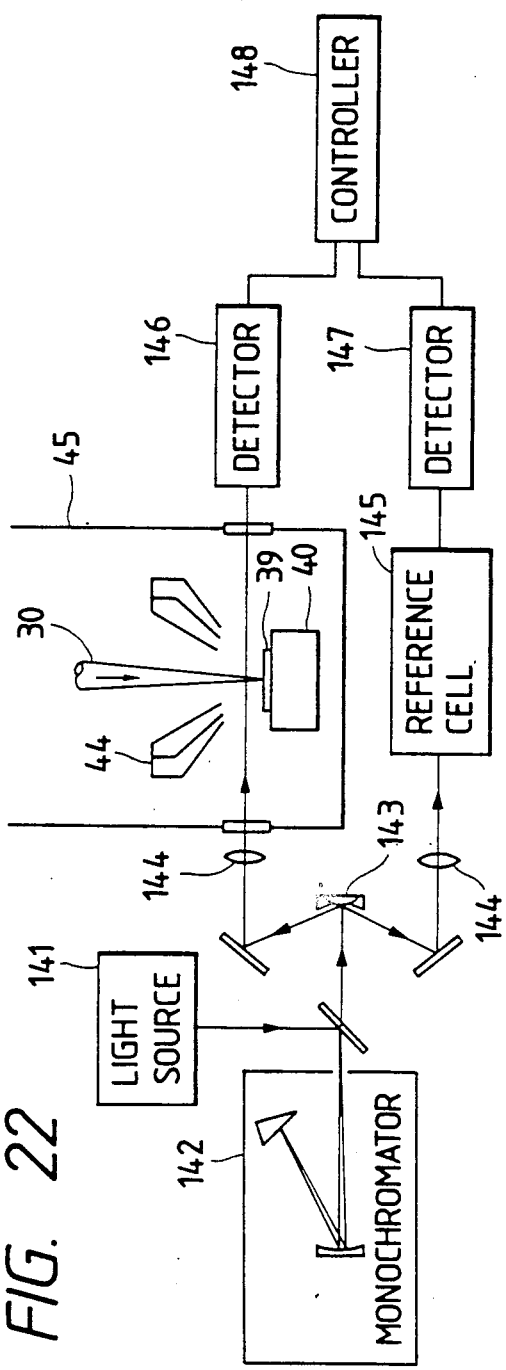
FIG. 22 shows the principle schematic diagram of detection of the layer boundary using light absorption of the reaction product.
Figure 23:
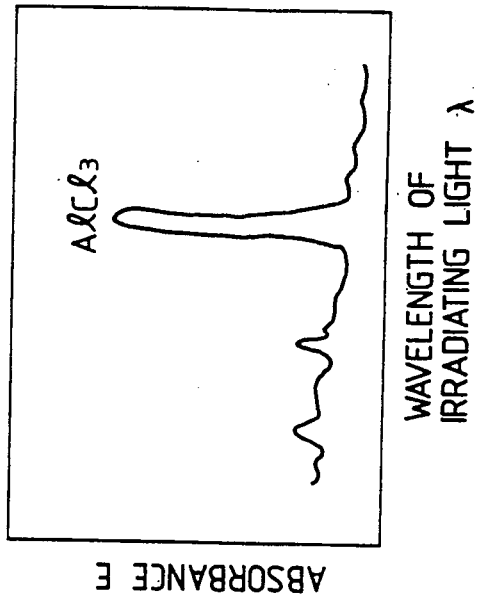
FIG. 23 shows an example of light absorption spectrums of the reaction product.

FIGS. 22 to 28 show the layer boundary detection method by detecting the reaction products. FIG. 22 shows a schematic diagram of the layer boundary detection system using light absorption of the reaction products. The light emitted from light source 141 such as a halogen lamp or a xenon lamp enters monochromator 142 and monochromatic light λ in wavelength (special) is fetched. In this case, the wavelength λ of the light to be fetched can be scanned by monochromator 142. The monochromatic light is divided into two parts by beam splitter 143, and one of them is focused and irradiated near the surface of sample 39 by focusing lens 144, and the transmitted light intensity is measured by detector 146 such as a photomultiplier. Another beam from beam splitter 143 is focused and irradiated onto reference cell 145 by focusing lens 144, and the transmitted light intensity is measured by detector 147. When a substance, which absorbs light, (a substance with an absorption band of the wavelength λ of the light) exists in the light path, a part of the incoming light is absorbed by it, and the transmitted light intensity decreases. Assuming that the concentration c of the light absorbing substance is constant and the thickness is d, the absorbance E (a physical value indicating the light absorbing degree) is expressed by the equation indicated below using the irradiation light intensity $I_o$ and the transmitted light intensity $I_t$.

$$E = log(I_o/I_t) = cd\epsilon$$

where ε is called the molecular absorption coefficient. By scanning the wavelength λ of the irradiation light, $I_t$ can be measured and a spectrum of absorbance E can be obtained. This spectrum has a peak which is unique to the type of light absorbing substance. Therefore, the light absorbing substance in the light path can be identified by the spectrum of absorbance E. When ion beam 30 is irradiated for locally reactive etching in FIG. 22, the transmitted light intensity is measured by detector 146 simultaneously and the absorbance spectrum is measured at a constant sampling interval. When etching an Al conductor with $CCl_4$ gas used, $AlCl_3$ is produced as a reaction product and a peak corresponding to $AlCl_3$ appears in the absorbance spectrum as shown in FIG. 23. When the etching of the Al conductor is finished, the peak of $AlCl_3$ is eliminated and the layer boundary can be detected. The layer boundary detection accuracy depends on the absorbance spectrum sampling interval. If the entire wavelength area is to be scanned every time, the sampling interval cannot be reduced. To prevent it, the wavelength $\lambda_1$, at which a peak of $AlCl_3$ appears, can be obtained beforehand by sealing $AlCl_3$ into reference cell 145 and using the measured value by detector 147. During Al conductor etching, each layer boundary can be detected in realtime by fixing the irradiation light wavelength to $\lambda_1$ and monitoring changes in the absorbance E. When etching multilayered LSIs, the wavelength, at which a peak corresponding to each reaction product, generated when each layer is being etched, appears, can be obtained beforehand. During etching, each layer boundary can be detected by irradiating the light with a wavelength corresponding to the layer to be etched and monitoring changes in the absorbance E by controller 148. When a change in the layer is detected, the reactant gas is switched by a control signal from controller 148 and the wavelength of the irradiation light from monochromator 142 is switched to the wavelength corresponding to the next layer to be etched by a control signal from controller 148. Then, the next layer boundary is detected by monitoring changes in the absorbance E in the same way.

In FIG. 22, reference numeral 30 designates an ion beam, 40 a stage, 44 an axially symmetric nozzle for supplying a plurality of gases, and 45 a vacuum chamber.

Figure 24:
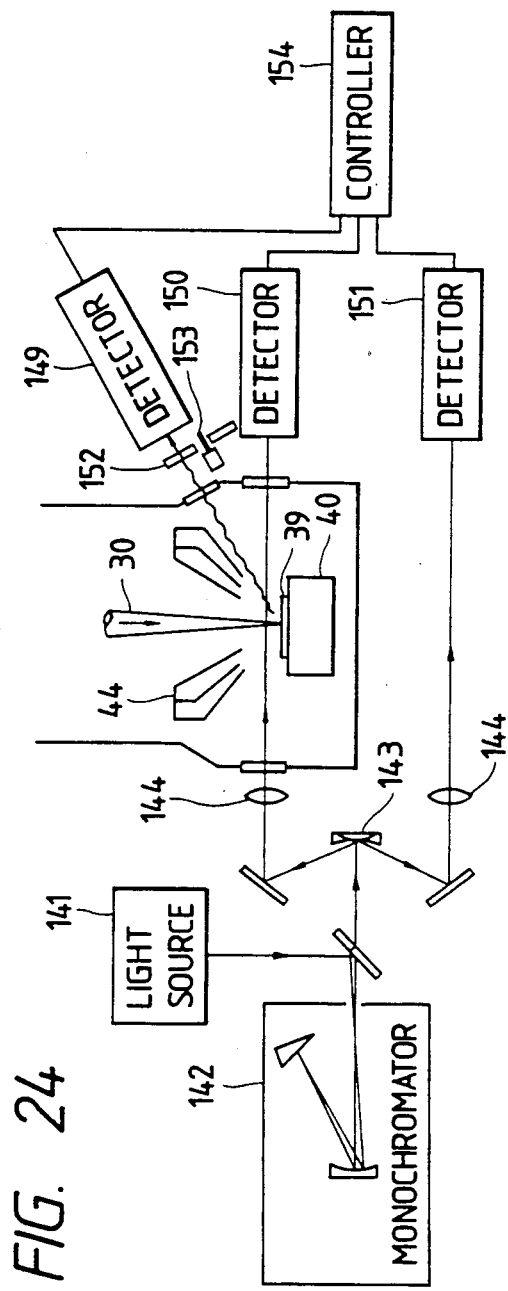
FIG. 24 shows the principle schematic diagram of detection of the layer boundary using fluorescence of the reaction product.
Figure 25:
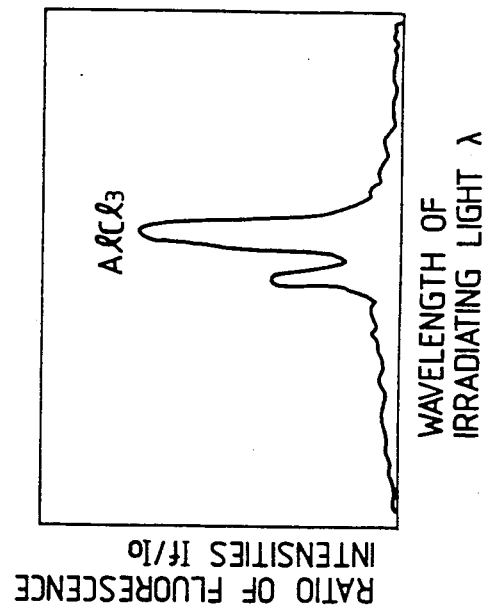
FIG. 25 shows an example of fluorescent spectrums of the reaction product.

FIG. 24 shows a schematic diagram of the layer boundary detection system using fluorescence of the reaction product. The irradiation light oscillation unit is the same as that in FIG. 22. The light is divided into two parts by beam splitter 143, and one of them is focused and irradiated near the surface of sample 39 by focusing lens 144 and the transmitted light intensity is measured by detector 150. The intensity of another beam from beam splitter 143 is measured by detector 151. The reaction product generated from sample 39 absorbs the irradiated light, and generates fluorescence with the wavelength shifted toward the long wavelength side (the low energy side) from the irradiated light. The fluorescence passes through filter 152, which allows only the wavelength band of the fluorescence to pass through, to prevent effects of scattered light from the irradiated light and enters detector 149 to measure the intensity. The fluorescence intensity $I_f$ can be measured by scanning the wavelength λ of the irradiated light and an induced fluorescence spectrum can be obtained. This spectrum has a peak which is unique to a fluorescent substance. Therefore, a substance in the light path can be identified by the peak of the induced fluorescent spectrum. The irradiated light intensity varies with the wavelength, so that it is recommended a spectrum be obtained by the ratio of the irradiated light intensity $I_o$ measured by detector 151 to the fluorescence light intensity $I_f$($I_f/I_o$). When ion beam 30 is irradiated for locally reactive etching in FIG. 24, the fluorescence intensity is measured by detector 149 simultaneously and the induced fluorescence spectrum is measured at a constant sampling interval. When etching an Al conductor with $CCl_4$ gas used, $AlCl_3$ is produced as a reaction product and a peak corresponding to $AlCl_3$ appears in the induced fluorescence spectrum as shown in FIG. 25. When the etching of the Al conductor is finished, the peak of $AlCl_3$ is eliminated and the layer boundary can be detected. The layer boundary detection accuracy depends on the induced fluorescence spectrum sampling interval. If the entire wavelength area is to be scanned every time, the sampling interval cannot be reduced. To prevent it, the wavelength $\lambda_1$, at which a peak of $AlCl_3$ appears in the induced fluorescence spectrum, can be obtained beforehand by etching Al on trial. During Al conductor etching, each layer boundary can be detected in realtime by fixing the irradiation light wavelength to $\lambda_1$ and monitoring changes in the fluorescence intensity $I_f$. When etching multilayered LSIs, the wavelength, at which a peak corresponding to each reaction product, generated when each layer is being etched, appears, can be obtained beforehand. During etching, each layer boundary can be detected by irradiating the light with a wavelength corresponding to the layer to be etched and monitoring changes in the fluorescence intensity $I_f$ by controller 154. When a change in the layer is detected, the reactant gas is switched by a control signal from controller 154 and the wavelength of the irradiation light from monochromator 142 is switched to the wavelength corresponding to the next layer to be etched by a control signal from controller 154. Then, the next layer boundary is detected by monitoring changes in the fluorescence intensity $I_f$ in the same way. If this occurs, the fluorescence wavelength band changes, so that the filter, which permits the fluorescence corresponding to the reaction product of the layer to be etched to pass through, is selected by filter switching unit 153. The fluorescence detection sensitivity is extremely higher than that in the case of absorption measurement, and the layer boundary detection accuracy when the fluorescence intensity $I_f$ is used is higher than that when the absorbance E is used.

Reference numerals 40, 44, 141, and 142 in FIG. 24 designate the same as those in FIG. 22.

Figure 26:
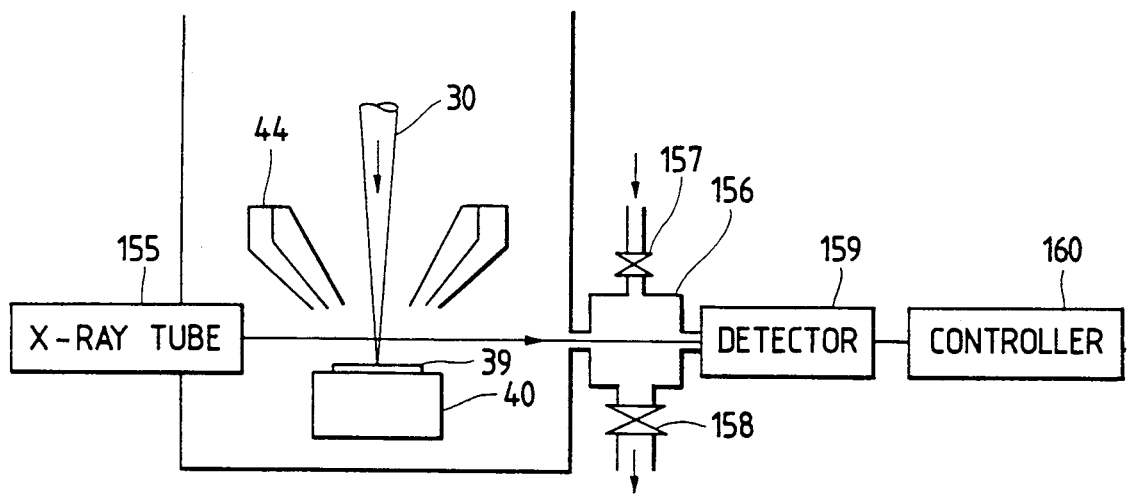
FIG. 26 shows the principle schematic diagram of detection of the layer boundary using characteristic X-ray absorption.

FIG. 26 shows a schematic diagram of the layer boundary detection system using absorbance of characteristic X-rays. In this example, characteristic X-rays emitted from the X-ray tube 155 are irradiated near the surface of sample 39, and the intensity of the X-rays passing through reference chamber 156 from the sample is measured by detector 159 through the filter. When etching an Al conductor using $CCl_4$ gas, $AlCl_3$ is produced as a reaction product. When an AlKα beam is used as X-rays, $AlCl_3$ absorbs the AlKα beam efficiently, and the transmitted X-ray intensity reduces. When the etching of the Al conductor is finished, the transmitted X-ray intensity increases and the layer boundary can be detected. By supplying the specified amount of $AlCl_3$ into reference chamber 156 and measuring changes in the transmitted X-ray intensity beforehand, the amount of $AlCl_3$ produced during etching can be evaluated. When etching multilayered LSIs, the wavelength of X-rays should be selected so that the reaction product of each layer, which is produced during etching, can efficiently absorb the X-rays. Methods available for that purpose are as follows: one is to use an X-ray tube 155 selected by switching from several which can emit X-rays of different wavelengths and the other is to use a continuous wavelength light source such as a continuous rare gas light source or a synchrotron radiation (SOR) source, a beam from which passes through a filter to select the specified wavelength.

During etching, each layer boundary can be detected by irradiating X-rays with a wavelength corresponding to the layer to be etched and monitoring changes in the transmitted X-ray intensity by controller 160. When a change in the layer is detected, the reactant gas is switched by a control signal from controller 160 and the wavelength of the X-rays is switched to the one corresponding to the next layer to be etched by a control signal from controller 160. Then, the next layer boundary is detected by monitoring changes in the transmitted X-ray intensity in the same way.

Reference numerals 30, 40, and 44 in FIG. 26 designate the same as those in FIG. 22, and numerals 157 and 158 designate valves.

Figure 27:
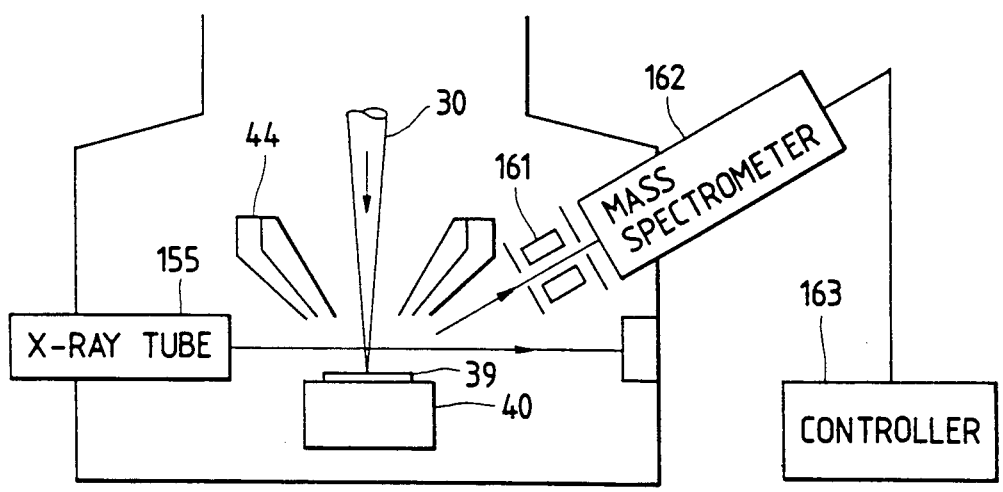
FIG. 27 shows the principle schematic diagram of detection of the layer boundary using reaction product ions.

FIG. 27 shows a schematic diagram of the layer boundary detection system using reaction product ions. The X-ray generation unit and irradiation unit are the same as those in FIG. 26, though a short wave light source such as an ultraviolet laser beam can be used. When X-rays of sufficient intensity are irradiated onto a reaction product when the locally reactive etching method of this invention is in use, the reaction product absorbs and dissociates into ions. By analyzing those ions, the material of the layer being etched can be detected. When etching an Al conductor using $CCl_4$ gas, $AlCl_3$ is produced as a reaction product. When a sufficiently strong AlKα beam from X-ray tube 155 is irradiated onto the reaction product, $AlCl_3$ is dissociated into $Al^{3+}$ and $Cl^-$. $Cl^-$ ions collide with each other or with $CCl_4$ gas flux, and most of them recombine into molecules. $Al^{3+}$ ions are kept in a comparatively stable state. $Al^{3+}$ ions are attracted by ion attraction optical system 161 using electrostatic lenses, and supplied into mass spectrometer 162 to detect the ion intensity. When the etching of the Al conductor is finished, the $Al^{3+}$ ion intensity is eliminated and the layer boundary can be detected. When etching multilayered LSIs, the wavelength of X-rays should be selected so that the reaction product of each layer, which is produced during etching, can efficiently absorb the X-rays. For this purpose, the X-ray irradiation unit can be provided with a wavelength selection function in the same way as the layer boundary detection system in FIG. 26. The ion species generated by dissociation of each reaction product is different from each other, so that the mass number to be detected by mass spectrometer 162, which is a detector, should coincide with the ion species.

During etching, each layer boundary can be detected by irradiating X-rays with a wavelength corresponding to the layer to be etched and monitoring changes in the ion intensity by controller 163. When a change in the layer is detected, the reactant gas is switched by a control signal from controller 163, the wavelength of the X-rays is switched to the one corresponding to the next layer to be etched by a control signal from controller 163, and the mass number to be detected by mass spectrometer 162 is switched to the one suited to the next layer to be etched. Then, the next layer boundary is detected by monitoring changes in the ion intensity in the same way.

Reference numerals 30, 39, 40, 44, and 155 in FIG. 27 designate the same as those in FIG. 26.

Figure 28:
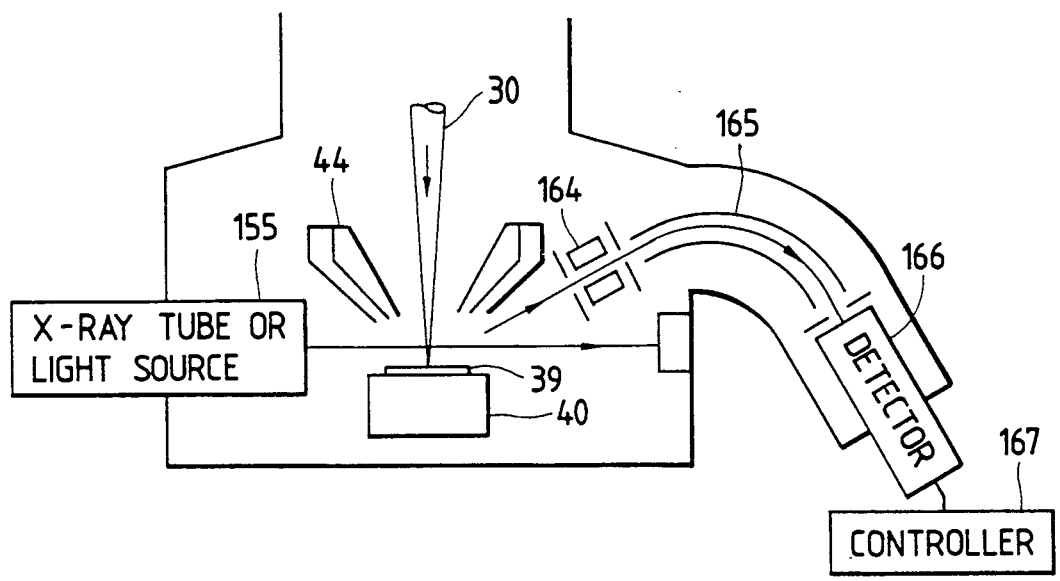
FIG. 28 shows the principle schematic diagram of detection of the layer boundary using photoelectron spectroscopy for the reaction product.

FIG. 28 shows a schematic diagram of the layer boundary detection system using photoelectron spectroscopy for the reaction product. In this example, excitation light emitted from a short wave light source 155 such as an X-ray tube and an ultraviolet laser beam is irradiated near the surface of sample 39. When excitation light of a sufficiently short wavelength (the photon energy $h_\nu$ is high) is irradiated onto a reaction product when the locally reactive etching method of this invention is in use, photoelectrons are emitted from the reaction product. By analyzing the energy of the photoelectrons, the type of the reaction product and the material of the layer being etched can be detected. When etching an Al conductor using $CCl_4$ gas, $AlCl_3$ is produced as a reaction product. The excitation light from light source 155 is irradiated onto the reaction product. The photoelectrons emitted from $AlCl_3$ are attracted by photoelectron attraction optical system 164 using electron lenses, and supplied into energy analyzer 165 to detect the photoelectron intensity by detector 166. From the photoelectron energy detected (energy set by energy analyzer 165 which the photoelectrons pass through), $AlCl_3$ can be identified. When the etching of the Al conductor is finished, the photoelectron signal from $AlCl_3$ is eliminated and the layer boundary can be detected. When etching multilayered LSIs, the excitation light, which is sufficiently shortened in wavelength, can be used commonly for detection of all the layer boundaries. The energy set by energy analyzer 165 should be switched sequentially in correspondence with the type of the reaction product generated at that time.

During etching, each layer boundary can be detected by setting the energy set by the energy analyzer to the value corresponding to the layer to be etched and monitoring changes in the photoelectron intensity by controller 167. When a change in the layer is detected, the reactant gas is switched by a control signal from controller 167, and the energy set by the energy analyzer is switched to the value corresponding to the next layer to be etched by a control signal from controller 167. Then, the next layer boundary is detected by monitoring changes in the photoelectron intensity in the same way.

Reference numerals 30, 39, 40, and 44 in FIG. 28 designate the same as those in FIG. 22.

As described above using FIGS. 22 to 28, each layer boundary can be detected by detecting the reaction product of the layer being etched. In this embodiment, each reaction product is given energy externally for detection, though the reaction product is excited by the reaction energy. The surplus energy is emitted as fluorescence or photoelectrons, which can be used for layer boundary detection. By detecting atoms or ions physically sputtered during etching, each layer boundary can be detected. By detecting each layer boundary using one of the methods mentioned above, the reaction gas corresponding to a change in the layer can be selected. By doing this, the locally reactive etching method can be executed using an optimum reactant gas (by which each layer can be etched at a high speed with high selectivity for the lower layer); that is, accurate etching along uneven layers at a high speed is available.

In this embodiment, after a change in the layer is detected, the reactant gas and the layer boundary detection conditions can be switched by a control signal from the controller. However, they can be switched manually without using the controller.

v) Etching process (2)

Figure 29:
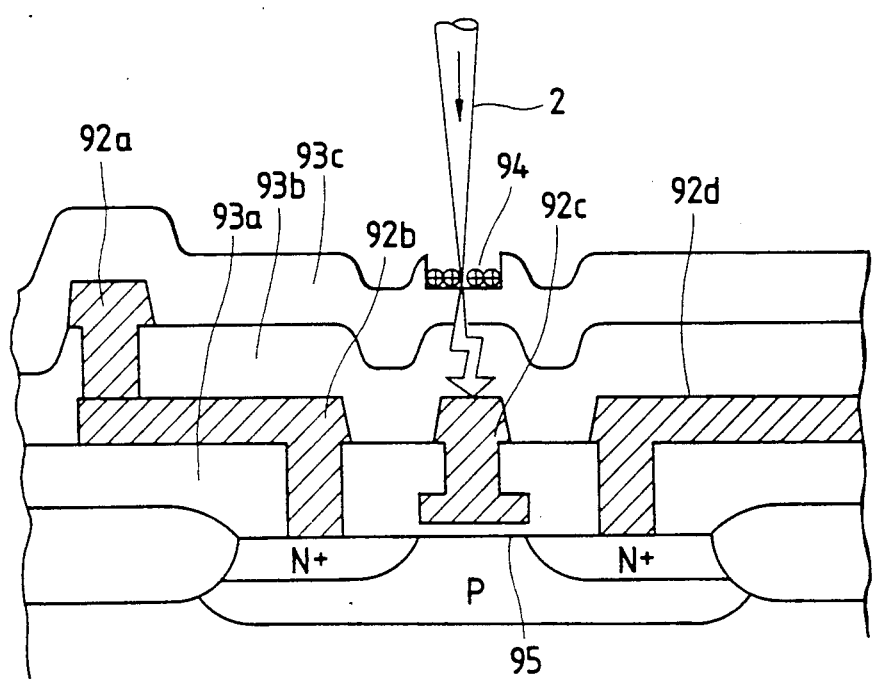
FIG. 29 shows device destruction by the conventional LSI etching method.

In Section iii) mentioned above, the locally reactive etching method using an ion beam is described. This section describes the multilayered LSI conductor repair method using the locally reactive etching method with an ion beam and that with a laser beam (see FIGS. 29 and 30). FIG. 29 shows the gate portion of a MOS device which is etched with an ion beam. Positive charges 94 transferred by the ion beam are accumulated in the etched hole and cause dielectric breakdown to gate electrode 92c. Consequently, the MOS device, which is sensitive for current, is easily broken down, resulting in a malfunction. This problem is imposed by both the conventional sputtering etching method and the locally reactive etching method of this invention when an ion beam is used for etching. The conventional laser etching method is a thermal etching method, which possibly breaks down each etching portion physically and is not suited for etching the gate portion. The method, which permits locally reactive etching to be done by irradiating a focused laser beam onto each layer in a reactance gas atmosphere, permits sensitive portions of each device such as the gate portion to be etched without breaking down the device. This is because moderate etching such that no device is broken down electrically due to no charge or physically due to chemical reaction is available.

Figure 30:
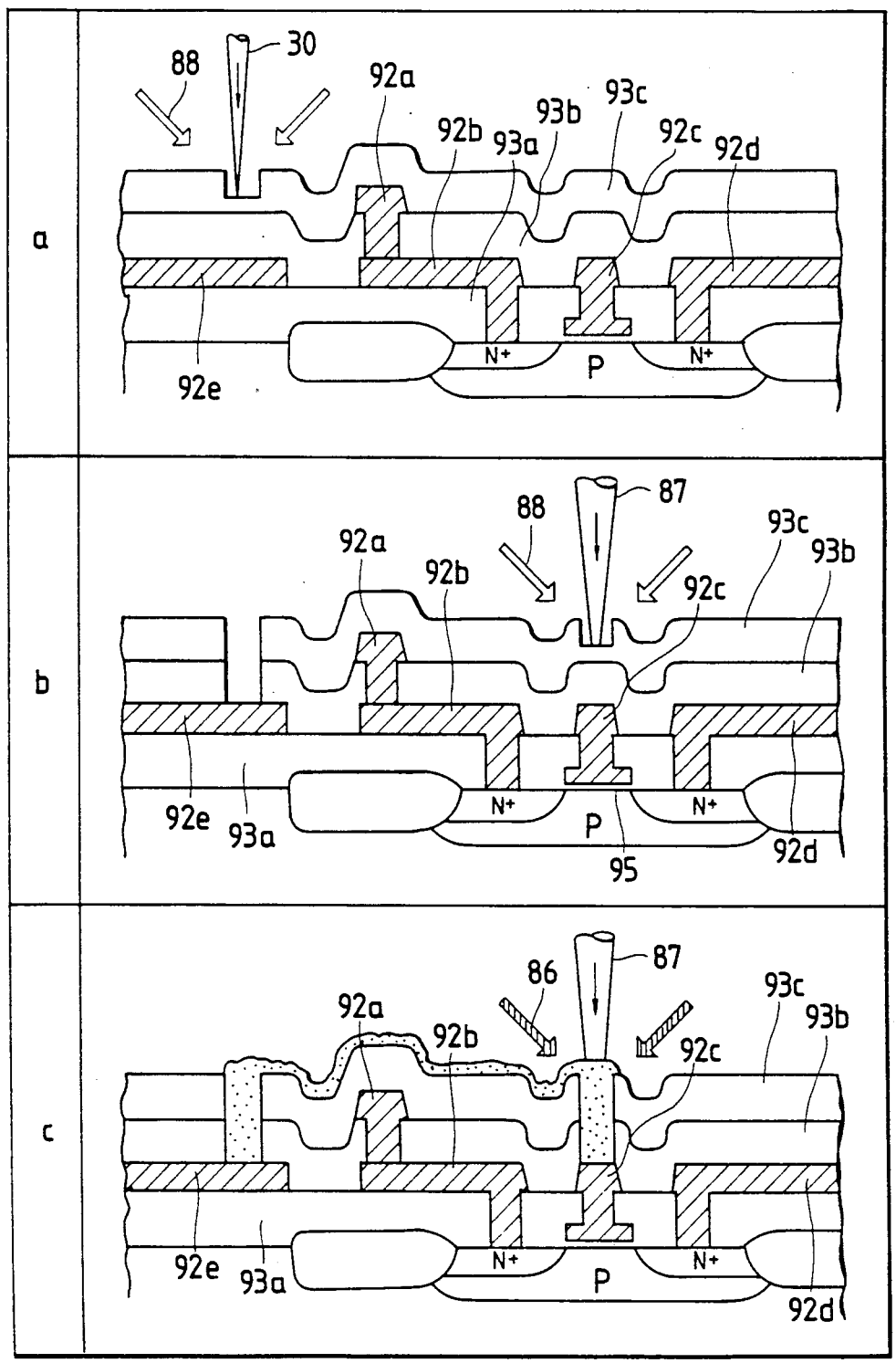
FIG. 30 shows LSI etching for prevention of device destruction by the present invention.

In the equipment of this embodiment, the configuration of which is shown in FIG. 1, an ion beam or a laser beam can be turned on or off optionally by a blanking electrode, which is not shown in FIG. 1, and shutter 53. By controlling the ion beam or the laser beam to turn on or off with an etching gas supplied through the nozzle, the locally reactive etching by the ion beam or by the laser beam can be optionally selected. The locally reactive etching method using an ion beam has an advantage that micro etching can be done at a high speed but has a disadvantage that a portion near a sensitive device cannot be etched due to dielectric breakdown by charges. The locally reactive etching method using a laser beam has an advantage that moderate etching can be done without breaking down a sensitive device but has a disadvantage that it is not suited for micro etching and the etching speed is low because the energy useful for chemical reaction is low. A combination of both advantages provides efficient etching of various multilayered LSIs. FIG. 30 shows an example of conductor repair of a MOS device. In FIG. 30a, the locally reactive etching method using an ion beam is used to etch a hole in Al conductor 92e which is sufficiently farther away from the sensitive device. In FIG. 30b, the locally reactive etching method using laser beam 87 is used to etch a hole in Al conductor 92c directly connected to the gate electrode to prevent the device from breakdown. After the contact hole is etched as mentioned above, the hole is filled by a CVD laser beam in FIG. 30c and a conductor is formed to connect Al conductor 92 e to Al conductor 92c. By doing this, a conductor near a sensitive device can be repaired without breaking down the device.

In FIGS. 29 and 30, reference numeral 2 denotes an ion beam, 86 a CVD gas, 88 an etching gas, 92a, 92b, and 92d Al conductors, 93a, 93b, and 93c insulating films, and 95 a gate.

vi) Gas nozzle

This section describes the structure of the gas nozzle unit in this embodiment (see FIGS. 31a to 37b). The nozzle unit of this invention is structurally required to spray an etching gas selected from several ones onto each sample. The simplest structure is that one nozzle is connected to several gas pipes via valves and each gas is selected by selecting the appropriate valve. This structure, however, has a disadvantage that the purity of a new gas to be sprayed may be decreased due to some of the previous gas which is adsorbed in the inner wall of the nozzle. In addition to it, the capacity between each valve and the gas outlet of the nozzle should be rather large, hence some of the gas remains there for a little while after the valve is closed, and the gas cannot be switched quickly. To improve the etching accuracy of this invention, a nozzle structure which can quickly select and spray one of several high purity reactance gases is required.

Figure 31A:
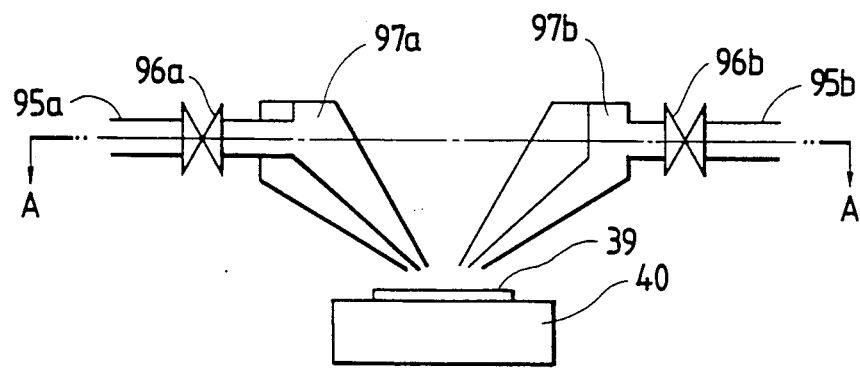
FIGS. 31a to 33b show the schematic diagrams of the gas nozzle structure of Embodiment 1.
Figure 31B:
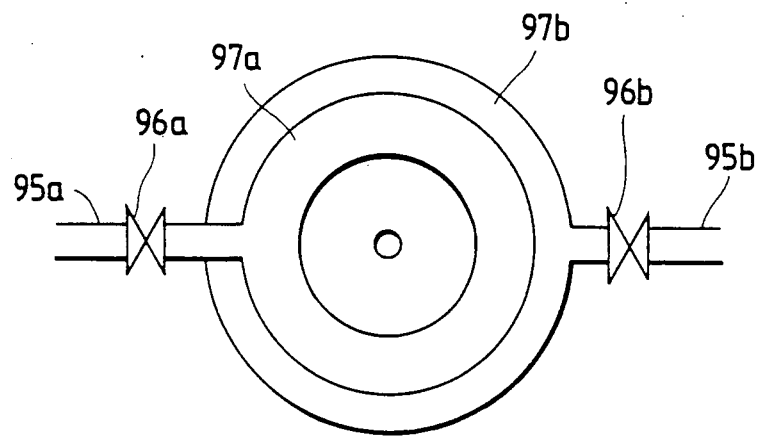
Figure 32A:
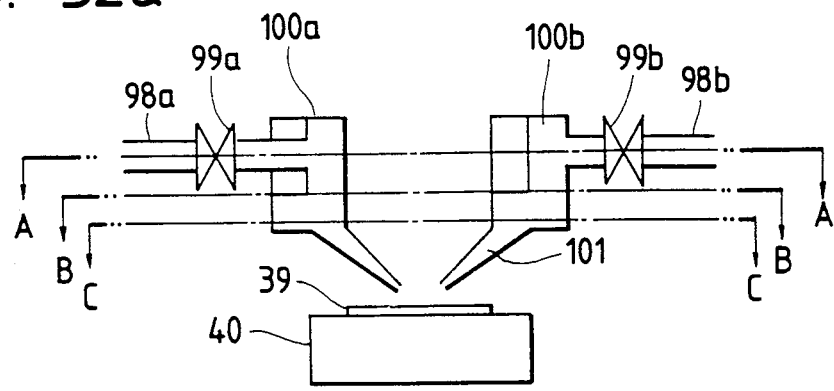
Figure 32B:
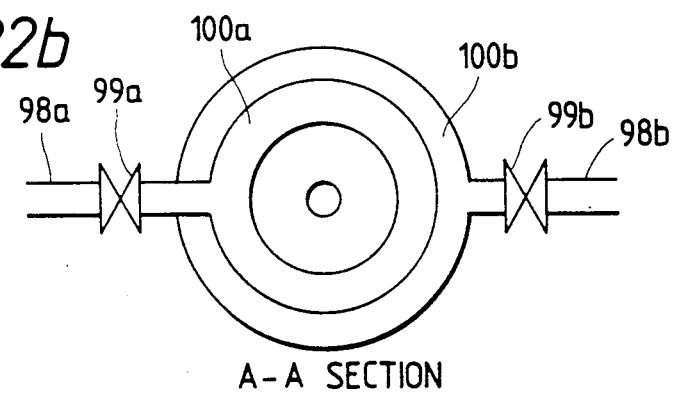
Figure 32C:
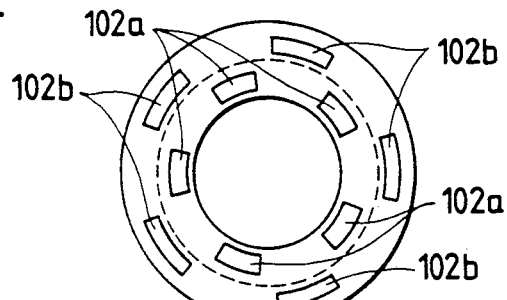
Figure 32D:
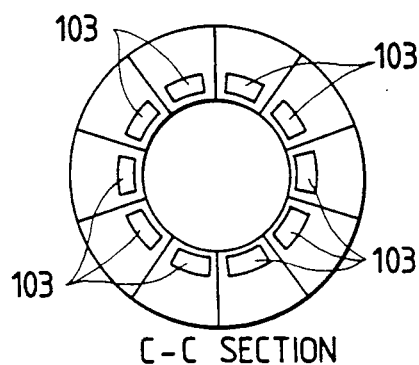
Figure 33A:
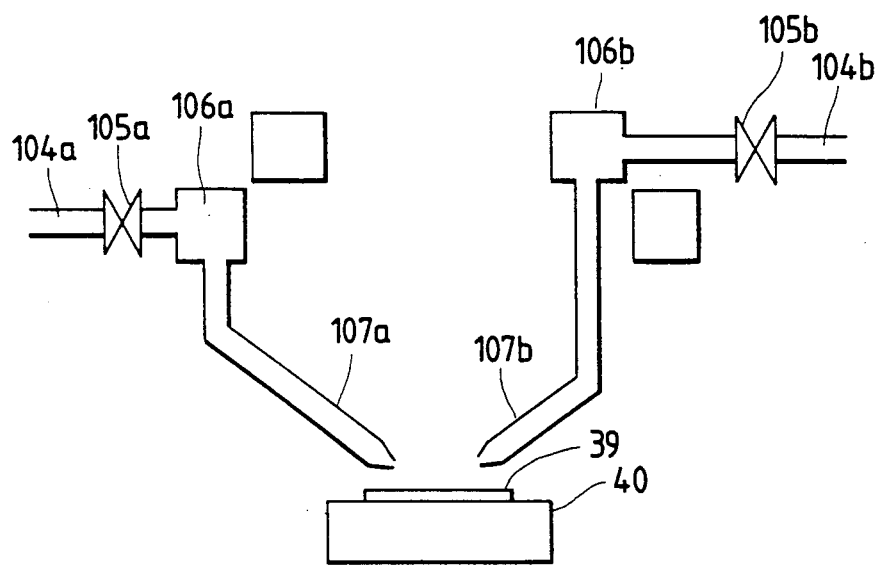
Figure 33B:
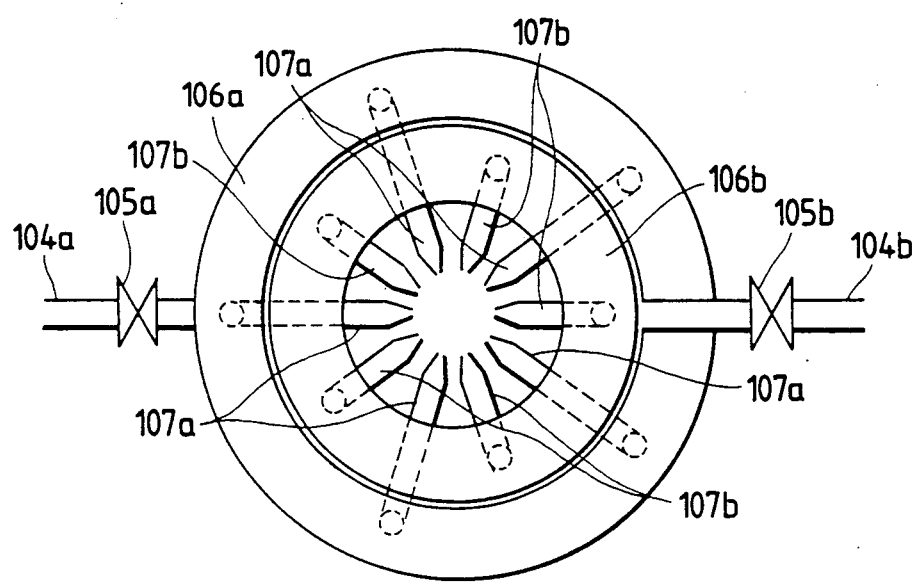

To spray one of several reactant gases in a high purity state, an independent nozzle can be provided for each gas. To prevent the etched form by the locally reactive etching method from variations, each gas nozzle has a structure of axially symmetric conductance for the ion beam axis to control the gas flow axisymmetrically. FIGS. 31a to 33b show examples of the nozzle structure satisfying the conditions mentioned above. FIGS. 31a and 31b show several conical nozzles different in diameter which are installed coaxially. FIG. 31b shows the AA section of the figure in FIG. 31a. One etching gas is supplied from pipe 95a via valve 96a into inner nozzle 97a, and sprayed onto sample 39 on stage 40. Another etching gas is supplied from pipe 95b via valve 96b into outer additional types of gases are required, additional nozzles can be installed coaxially. FIGS. 32a to 32d show conical nozzle 101 which is divided into several small equal chambers by planes containing the axis of nozzle 101. One etching gas is supplied from pipe 98a via valve 99a into inner gas chamber 100a, and sprayed onto sample 39 on stage 40 from inner aperture 102a and aperture 103 via nozzle 101. Another etching gas is supplied from pipe 98b via valve 99b into outer gas chamber 100b, and sprayed onto sample 39 from outer aperture 102b and aperture 103 via nozzle 101. When additional types of gases are required, the number of divisions of conical nozzle 101 can be increased and additional gas chambers 100a and 100b can be installed coaxially. The nozzle in FIGS. 32a to 32d has a slightly complicated structure but can spray more than one etching gas onto sample 39 at the same angle. FIG. 33a (vertical section) and FIG. 33b (top view) show tubular nozzles 107a and 107b with equal conductance which are installed axisymmetrically for ring pipe shape gas chambers 106a and 106b. One etching gas is supplied from pipe 104a via valve 105a into outer gas chamber 106a, and sprayed onto sample 39 on stage 40 from tubular nozzle 107a. The other etching gas is supplied from pipe 104b via valve 105b into inner gas chamber 106b, and sprayed onto sample 39 from tubular nozzle 107b. When additional types of gases are required, additional ring pipe shape gas chambers 106a and 106b and additional tubular nozzles 107a and 107b can be installed.

Figure 34:
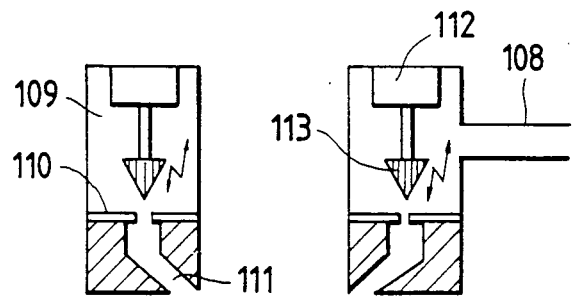
FIGS. 34 to 37b show the schematic diagrams of the gas change valve structure of Embodiment 1.
Figure 35A:
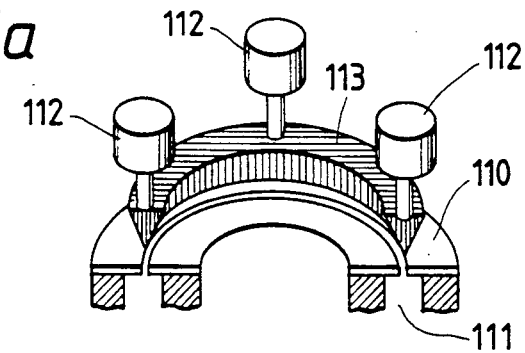
Figure 35B:
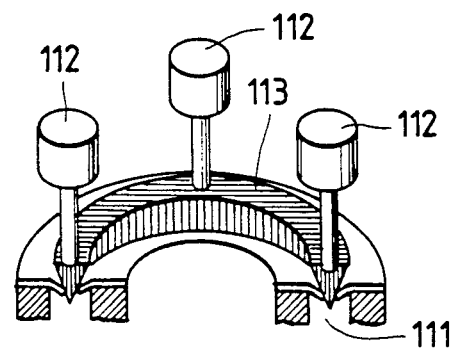
Figure 36:
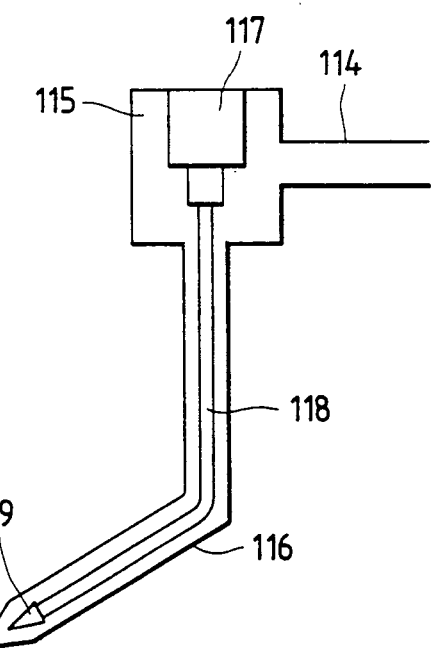
Figure 37A:
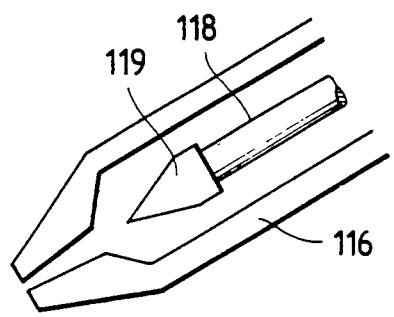
Figure 37B:
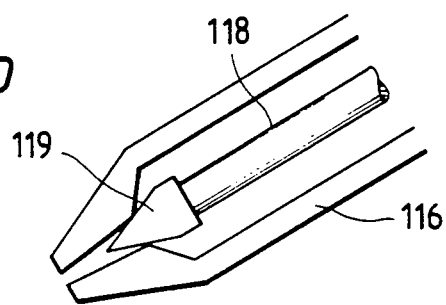

FIGS. 34 to 37 show the valve structure for switching more than one etching gas quickly. To switch a gas quickly, no part of the gas should be left within the nozzle after the corresponding valve is closed. For that purpose, each valve should be installed as close to the gas outlet of the nozzle as possible. FIG. 34 shows a circumferential valve. Partition 110 is installed near the gas outlet of conical or cylindrical nozzle 111, and circumferential wedge 113 is used to open or close the valve. Reference numeral 108 designates a pipe and 109 a gas chamber. FIGS. 35a and 35b show the operation of the valve in FIG. 34. When piezoelectric device 112 driven by a voltage from a voltage application unit, which is not shown in the figure, contracts, wedge 113 is separated from partition 110 as shown in FIG. 35a and the valve is opened. When piezoelectric device 112 expands, wedge-shaped gas change valve 113 is pressed into the gap of partition 110 as shown in FIG. 35b and the valve is closed. FIG. 36 shows an example of a valve of a tubular nozzle. The valve is opened or closed by moving wedge 119, which is installed within the tip of tubular nozzle 116, with piezoelectric device 117 (driven by a voltage from a voltage application unit which is not shown in the figure) connected via flexible arm 118. Reference numeral 114 denotes a gas pipe and 115 a gas chamber. FIG. 36. When piezoelectric device 117 contracts, wedge 119 is separated from the gas outlet at the tip of tubular nozzle 116 as shown in FIG. 37a and the valve is opened. When piezoelectric device 117 expands, wedge-shaped gas change valve 119 is pressed into the gas outlet at the tip of tubular nozzle 116 as shown in FIG. 37b and the valve is closed.

Embodiment 2

Figure 38:
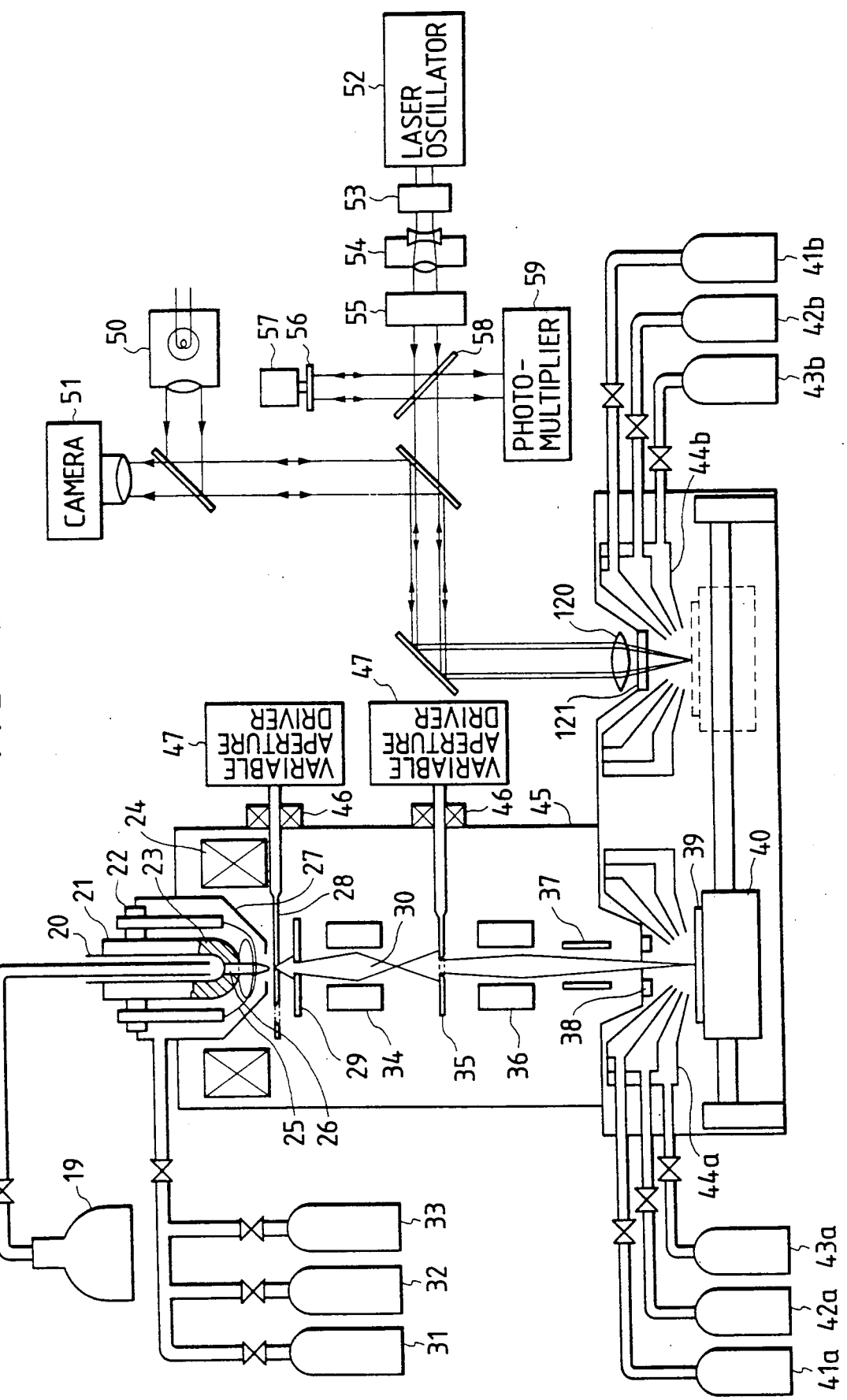
FIG. 38 shows the schematic diagram of a micro etching system of Embodiment 2.

FIG. 38 shows the equipment configuration of Embodiment 2 of this invention. In this embodiment, the ion beam optical system and the optical system having the laser oscillator and the light microscope, which are installed coaxially in Embodiment 1, are installed independently in two axes. Each component of each optical system has the same function as that in Embodiment 1. When the uniaxial structure is changed to the biaxial structure, the locally reactive etching method using an ion beam cannot be executed by optically monitoring the etched depth and etching status. In the case of the process combining etching or CVD employing an ion beam with etching or CVD employing a laser beam, each sample should be moved or positioned using the stage. In the biaxial structure, however, the number of degrees of freedom for design of each optical system is increased and an optimum design can be provided. Both optical systems can minimize the operation distance, so that the focusing performance can be improved and a finer beam can be generated. The locally reactive etching method with an ion beam differs in beam energy density useful for chemical reaction from that with a laser beam. As a result, both methods differ in the optimum etching gas flow rate from each other. In this embodiment, the two optical systems are provided with etching gas supply systems independently, and the gas flow rate of each optical system can be set to an optimum value beforehand.

In FIG. 38, reference numerals 41a, 41b, 42a, and 42b designate etching gas cylinders, 43a and 43b CVD gas cylinders, 44a and 44b axisymmetric nozzles for several-gas supply, 120 an objective lens, 121 a hole, and other

Embodiment 3

Figure 39:
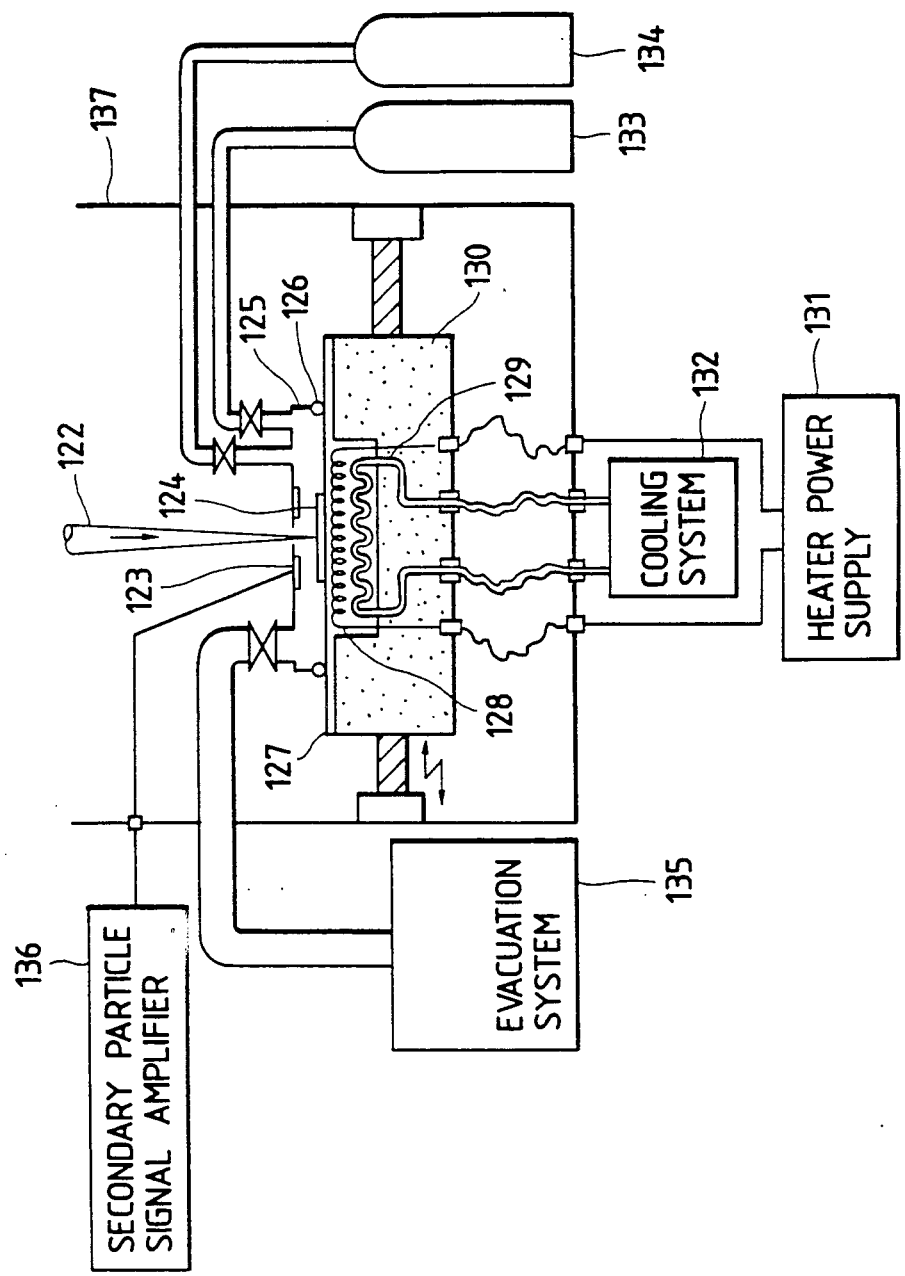
FIG. 39 shows the equipment schematic diagram of the stage of Embodiment 3.

FIG. 39 shows the configuration of the stage in Embodiment 3 of this invention. One of the most important components for executing this invention is a gas supply system to quickly switch and supply one of several types of gases near each sample. In Embodiments 1 and 2, several reactant gas cylinders are connected to the nozzle installed near the stage via valves, and each gas can be selected by selecting the corresponding valve, so that the gas sprayed near the sample can be switched. The gas pressure should be high only in an area very close to the etching portion, so that the gas flow rate may be low and the gas can be quickly switched by switching the valve.

To switch and supply one of several reactant gases quickly near each sample in this embodiment, sample chamber 125 small in capacity is installed on the stage. The equipment configuration except the gas supply system and the stage is the same as that in Embodiment 1 or 2. Several reactant gas cylinders 133 and 134 (for etching) are connected to sample chamber 125 via valves, and each gas to be supplied into sample chamber 125 can be selected by selecting the corresponding valve. To exhaust sample chamber 125 quickly when a gas is to be switched, vacuum system 135 at a high exhaust rate is connected to sample chamber 125. To produce secondary particle images to be used to observe a sample during positioning or the like of it for etching, secondary particle detector 123 is installed within sample chamber 125. Sample 124 moves together with stage 127, so that sample chamber 125 is connected to stage 127 with slide seal unit 126 such as an O-ring. By doing this, a gas can be sealed within sample chamber 125 and stage 127 can be moved. Within stage 127, heater 128 is installed for heating and cooling pipe 129 is installed for cooling. Heater 128 is connected to heater power supply 131, and cooling pipe 129 is connected to chiller 132. Stage 127 is made small in volume to reduce the heat capacity, and installed on heat insulating material 130 to prevent heat from transmission to other units. Heater power supply 131 and chiller 132 can be used to control the temperature of stage 127 quickly.

In FIG. 39, reference numeral 122 denotes an ion beam, 136 a secondary particle signal amplifier, and 137 a chamber.

Figure 40A:
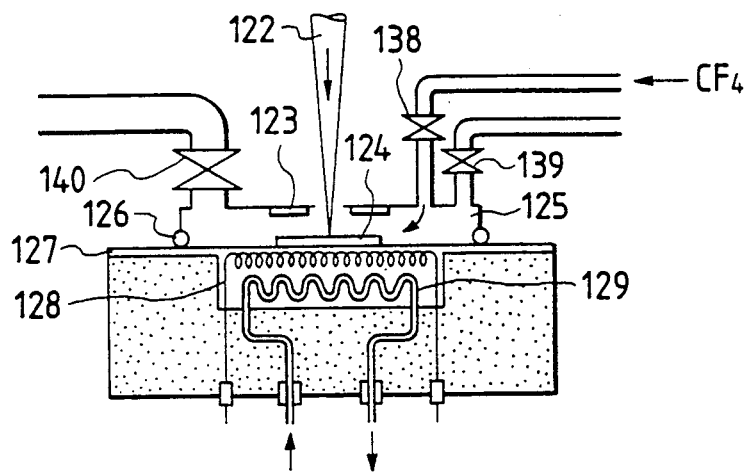
FIGS. 40a to 40c show the principle schematic diagrams of the etching method of Embodiment 3.
Figure 40B:
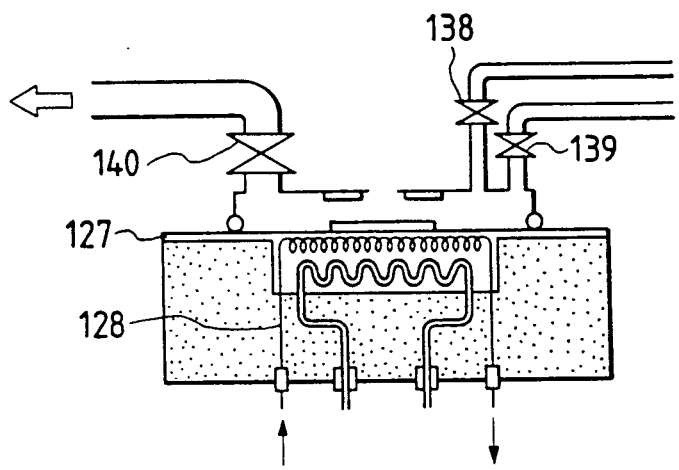
Figure 40C:
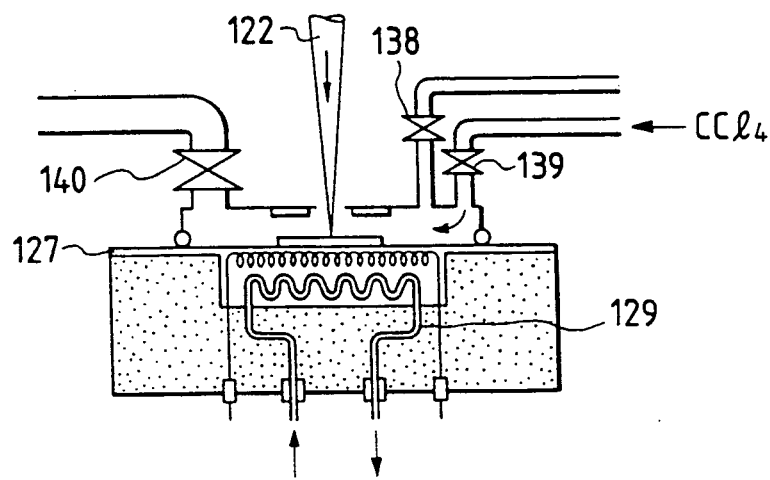

FIGS. 40a to 40c show the reactant gas switching operation in this embodiment. The $CF_4$ and $CCl_4$ gas cylinders are connected to sample chamber 125 via valves 138 and 139 respectively. The vacuum system for gas exhaust is connected to sample chamber 125 via valve 140. In FIG. 40a, $CF_4$ gas can be supplied into sample chamber 125 by closing valves 140 and 139 and opening valve 138. The locally reactive etching method can be executed by cooling the stage 127 by cooling pipe 129 with the chiller turned on and by irradiating ion beam 122 onto sample 124 by accelerating adsorption of $CF_4$ molecules into the sample. In FIG. 40b, the $CF_4$ gas can be exhausted from sample chamber 125 by closing valve 138 and opening valve 140. $CF_4$ molecules can be exhausted quickly from the sample chamber by heating stage 127 by heater 128 with the heater power supply turned on and by accelerating emission of the $CF_4$ molecules from the sample. To prevent the reactive etching from proceeding because the sample rises in temperature, the temperature of stage 127 is controlled to lower than the reaction temperature. In FIG. 40c, $CCl_4$ gas can be supplied into sample chamber 125 by closing valve 140 and opening valve 139. The locally reactive etching method can be executed by cooling the stage 127 and irradiating ion beam 122 onto sample 124 by accelerating adsorption of $CCl_4$ molecules into the sample in the same way as in FIG. 40a.

The locally reactive etching method of this invention is a process in which the etching is accelerated by vaporization of a reaction product, which is produced by chemical reaction of reactant gas molecules adsorbed into the sample surface with sample atoms by the energy of the irradiated beam. To increase the etching speed, the reactant gas molecule adsorption probability should be increased and the vaporization of the reaction product should be accelerated. As the sample temperature decreases, the reactant gas molecule adsorption probability increases, and as the sample temperature increases, the vaporization of the reaction product is accelerated. Under the condition of directly-opposed characteristics of the two, an optimum sample temperature range exists.

FIGS. 40a and 40c show only the operation of the chiller. By using the heater power supply and the chiller, the sample temperature can be controlled within the optimum range. To prevent the reactive etching from proceeding overall the sample because the sample temperature rises excessively, the sample temperature should be controlled lower than the reaction temperature.

In FIGS. 40a to 40c, reference numeral 123 denotes a secondary particle detector and 126 a slide seal unit.

The same reference numerals in the figures given above designate the same parts or units. It goes without saying that the micro etching system of this invention, mentioned above, is equipped with a power supply controller to drive each unit of the system.

This invention provides locally reactive etching of multilayered devices by selecting and supplying an optimum reactant gas (suited for high speed etching of a layer with high selectivity for the lower layer) one by one in accordance with changes in the layer being etched and the under layer, that is, accurate etching along uneven layers at a high speed.

What is claimed is:

1. In a micro etching method of irradiating an energy beam to a workpiece in an atmosphere of reactant gas to apply reactive etching locally on an irradiation portion of said workpiece; a multilayered device micro etching method comprising steps of:
    detecting a material change of layer currently being etched;
    switching said reactant gas after detecting said material change; and
    locally reactive etching a second layer by supplying a gas complying with a material of the second layer being etched, as said reactant gas.

2. The multilayered device micro etching method of claim 1, wherein said energy beam is the one selected among groups comprising ion beams, electron beams and laser beams.

3. The multilayered device micro etching method of claim 1, wherein an energy beam is selected and used therein complying with the characteristics of the portion of the layer currently being etched.

4. A multilayered device micro etching method comprising steps of:

i) locally reactive etching an exposed layer of a workpiece by irradiating an energy beam to said workpiece in an atmosphere of reactant gas complying with the material of said exposed layer of the workpiece;

ii) detecting the completion amount of etching said exposed layer of the workpiece by detecting and monitoring the material of the layer currently being etched;

iii) locally reactive etching a newly exposed layer by irradiating said energy beam to said workpiece in the atmosphere of reactant gas complying with the material of the layer located under said exposed layer and newly exposed due to the etching of said exposed layer, after detecting the completion moment of etching of said exposed layer.

5. The multilayered device micro etching method of claim 4, wherein said steps ii) and iii) are repeated until every layer required to be etched is etched.

6. In a micro etching method of irradiating a reactive beam, generated by extracting an ionized reactant gas, to a workpiece to apply reactive etching locally on an irradiation portion of said workpiece; a multilayered device micro etching method comprising steps of i) detecting a material change of a first layer being etched, ii) switching reactant gas to be ionized, after said material change, and iii) subsequently irradiating a reactive beam of an ion species complying with a material of a second layer being etched, to said workpiece.

7. A multilayered device micro etching method comprising steps of:

i) etching an exposed layer of a workpiece by irradiating to the workpiece of a reactive beam of an ion species complying the material of said exposed layer of said workpiece;

ii) detecting the completion moment of etching said exposed layer of the workpiece by detecting and monitoring a material change at a boundary of the layer currently being etched;

iii) etching a newly exposed layer by irradiating to said workpiece a reactive beam of an ion species complying with the material of the layer located under said exposed layer and newly exposed due to the etching of said exposed layer, after detecting the completion moment of etching of said exposed layer.

8. The multilayered device micro etching method of claim 7, wherein said steps ii) and iii) are repeated until every layer required to be etched is etched.

9. In a micro etching system comprising an energy beam source, a focusing optical system, a stage, a secondary particle detector, reactant gas supply means and a power supply controller for driving them, means for applying reactive etching locally on a irradiation portion of a workpiece by irradiating an energy beam to said workpiece in the atmosphere of reactant gas; the multilayered device micro etching system, provided with means for detecting the change of the material of layer to be etched and means for switching and supplying a plurality of reactant gases.

10. The multilayered device micro etching system of claim 9, wherein said energy source is one generating an energy beam selected from among the group consisting of an ion beam, an electron beam and a laser beam.

11. The multilayered device micro etching system of claim 9, wherein said means for switching and supplying a plurality of reactant gases comprises a plurality of reactant gas cylinders, pipe lines, valves, nozzles for locally spraying reactant gas in the vicinity of sample and a power supply controller for driving them.

12. The multilayered device micro etching system of claim 9, wherein said means for switching and supplying a plurality of reactant gases comprises a plurality of reactant gas cylinders, pipe lines, valves, a chamber for sealing reactant gas around a sample, exhaust system and a power supply controller for driving them.

13. In a micro etching system comprising an ion source for ionizing a reactant gas, a focusing optical system, a stage, a secondary particle detector and a power supply controller for driving them, means for locally applying reactive etching by irradiating to the workpiece the reactive beam generated by extracting an ionized reactant gas; the multilayered device micro etching system comprising, means for detecting the change of the material of layer to be etched and means for switching a plurality of reacting gases and supplying them to said ion source.

14. A micro etching method to be applied on a multilayered device, comprising the steps of:

supplying a first optimum reactive gas in an atmosphere provided with a desired portion of a multilayered device so that an upper insulating layer is etched at a first predetermined etching selectivity thereof to a lower conductive layer by chemically-reacting in the atmosphere of said first optimum reactive gas;

chemical-reactive-etching locally at the first predetermined etching selectivity said upper insulating layer by irradiating a first energy beam to said desired portion of the multilayered device in said atmosphere of said supplied remove said upper insulating layer along a surface shape of the lower conductive layer on said desired portion of the multilayered device;

detecting a material change from the upper insulating layer to the lower conductive layer at said desired portion;

supplying second optimum reactive gas in the atmosphere after detecting said material change so that said lower conductive layer is etched at a second predetermined etching selectivity thereof to a lower insulating layer by chemically reacting in the atmosphere of said second optimum reactive gas; and chemical-reactive-etching locally at said second etching selectivity said lower conductive layer by irradiating a second energy beam to said desired portion of the multilayered device in said atmosphere of said supplied second optimum reactive gas so that an added wiring connection can be provided on a surface of the lower insulating layer by accurately removing said lower conductive layer without leaving said conductive layer along a surface shape of the lower insulating layer at said desired portion of the multilayered device.

15. A micro etching method to be applied on a multilayered device comprising the steps of:

supplying a first optimum reactive gas in an atmosphere provided with a desired portion of the multilayered device so that an upper insulating layer is etched at a first predetermined etching selectivity thereof to a lower conductive layer by chemical-reacting in the atmosphere of said first optimum reactive gas;

chemical-reactive-etching locally at the etching selectivity said upper insulating layer by irradiating a first energy beam to said desired portion of the multilayered device in said atmosphere of said supplied first optimum reactive gas so as to accurately remove said upper insulating layer along the surface shape of the lower conductive layer on said desired portion of the multilayered device;

detecting a material change from the upper insulating layer to the lower conductive layer at said desired portion;

gas-changing and supplying a second optimum reactive gas in the atmosphere after detecting said material change so that said lower conductive layer is etched at a second predetermined etching selectivity thereof to a lower insulating layer by chemically reacting in the atmosphere of said second optimum reactive gas; and chemical-reactive-etching locally at said second predetermined etching selectivity said lower conductive layer by irradiating a second energy beam to said desired portion of the multilayered device in said atmosphere of said supplied second optimum reactive gas so as to remove accurately said lower conductive layer without leaving said conductive layer along the surface shape of the lower insulating layer at said desired portion of the multilayered device.

16. A micro etching method to be applied on a multilayered device comprising the steps of:

supplying a first optimum reactive source gas in an ion source so that an upper insulating layer is etched at a predetermined etching selectivity thereof to a lower conductive layer on a desired portion of the multilayered device by chemical ionized reacting by irradiating a first reactive ionized beam extracted from said ion source;

chemical-reactive-etching locally at the etching selectivity said upper insulating by irradiating the first reactive ionized beam to said desired portion of the multilayered device so as to remove accurately said upper insulating layer along the surface shape of the lower conductive layer at said desired portion of the multilayered device, said first reactive ionized beam being extracted by reacting said first optimum reactive source gas with an electric yield in said ion source;

detecting a material change from the upper insulating layer to the lower conductive layer on said desired portion;

gas-changing and supplying a second optimum reactive source gas in the ion source after detecting said material change so that said lower conductive layer is etched at another predetermined etching selectivity thereof to a lower insulating layer by chemical ionized reacting by irradiating a second reactive ionized beam extracted from said ion source; and chemical-reactive-etching locally at said another etching selectivity said lower conductive layer by irradiating a second reactive ionized beam to said desired portion of the multilayered device so as to accurately remove said lower conductive layer without leaving said conductive layer along the surface shape of the lower insulating layer at said desired portion of the multilayered device, said second reactive ionized beam being extracted by reacting said second optimum reactive source gas with an electric field in said ion source.

17. A micro etching system for use in association with a multilayered device, comprising:

first supplying means for supplying first optimum reactive gas in an atmosphere provided with a desired portion of the multilayered device so that an upper insulating layer is etched at a first predetermined etching selectivity thereof to a lower conductive layer by chemical-reacting in the atmosphere of said first optimum reactive gas;

first chemical reactive etching means for chemical-reactive etching locally at the etching selectivity said upper insulating layer by irradiating a first energy beam to said desired portion of the multilayered device in said atmosphere of said first optimum reactive gas supplied by said first supplying means so as to accurately remove said upper insulating layer along a surface shape of the lower conductive layer on said desired portion of the multilayered device;

detecting means for detecting a material change from the upper insulating layer to the lower conductive layer at said desired portion being chemical-reactive-etched by said first chemical reactive etching means;

gas-changing and second supplying means for gas-changing and supplying second optimum reactive gas in the atmosphere in accordance with detecting said material change by said detecting means so that said lower conductive layer is etched at a second predetermined etching selectivity thereof to a lower insulating layer by chemical-reacting in the atmosphere of said second optimum reactive gas; and second chemical reactive etching means for chemical-reactive etching locally at said second etching selectivity said lower conductive layer by irradiating a second energy beam to said desired portion of the multilayered device in said atmosphere of said second optimum reactive gas switched on and supplied by said gas changing and second supplying means so that an added connection wiring can be provided on a surface of the lower insulating layer by accurately removing said lower conductive layer without leaving said conductive layer along the surface of the lower insulating layer at said desired portion of the multilayered device.

18. A micro etching system for applying on a multilayered device comprising:

first supplying means for supplying first optimum reactive gas in an atmosphere provided with a desired portion of the multilayered device so that an upper insulating layer is etched at a first predetermined etching selectivity thereof to a lower conductive layer by chemical-reacting in the atmosphere of said first optimum reactive gas;

first chemical reactive etching means for chemical-reactive etching at the etching selectivity said upper insulating layer by irradiating a first energy beam to said desired portion of the multilayered device in said atmosphere of said first optimum reactive gas supplied by said first supplying means so as to accurately remove said upper insulating layer along the surface shape of the lower conductive layer on said desired portion of the multilayered device;

detecting means for detecting a material change from the upper insulating layer to the lower conductive layer at said desired portion being chemical-reactive-etched by said first chemical reactive etching means;

gas-changing and second supplying means for gas-changing and supplying second optimum reactive gas in the atmosphere in accordance with detecting said material change by said detecting means so that said lower conductive layer is etched at a second predetermined etching selectivity thereof to a lower insulating layer by chemical-reacting in the atmosphere of said second optimum reactive gas; and second chemical reactive etching means for chemical-reactive etching at said second predetermined etching selectivity said lower conductive layer by irradiating a second energy beam to said desired portion of the multilayered device in said atmosphere of said second optimum reactive gas switched on and supplied by said gas-changing and second supplying means so as to accurately remove said lower conductive layer without leaving said conductive layer along the surface of the lower insulating layer at said desired portion of the multilayered device.

19. A micro etching system for applying on a multilayered device comprising:

first supplying means for supplying a first optimum reactive source gas in an ion source so that an upper insulating layer is etched at a first predetermined etching selectivity thereof to a lower conductive layer on a first desired portion of the multilayered device by chemical ionized reacting by irradiating a first reactive ionized beam extracted from said ion source;

first chemical reactive etching means for chemical-reactive etching locally at the etching selectivity said upper insulating layer by irradiating the first reactive ionized beam to said first desired portion of the multilayered device so as to accurately remove said upper insulating layer along the surface shape of the lower conductive layer at said first desired portion of the multilayered device, said first reactive ionized beam being extracted by reacting said first optimum reactive source gas supplied by said first supplying means with an electric field in said ion source;

detecting means for detecting a material change from the upper insulating layer to the lower conductive layer on said first desired portion;

gas-changing and second supplying means for gas-changing and supplying second optimum reactive source gas in the ion source in accordance with detecting said material change by said detecting means so that said lower conductive layer is etched at a second predetermined etching selectivity thereof to a lower insulating layer by chemical ionized reacting by irradiating a second reactive ionized beam extracted from said ion source; and second chemical reactive etching means for chemical-reactive etching locally at said second etching selectivity said lower conductive layer by irradiating a second reactive ionized beam to said desired portion of the multilayered device so as to accurately remove said lower conductive layer without remaining said conductive layer along the surface shape of the lower insulating layer at said desired portion of the multilayered device, said second reactive ionized beam being extracted by reacting said second optimum reactive source gas switched on and supplied by said gas changing and second supplying means with an electric field source.

* * * * *